US008525403B2

(12) United States Patent
Aoki et al.

(10) Patent No.: US 8,525,403 B2
(45) Date of Patent: Sep. 3, 2013

(54) ORGANIC LED ELEMENT, GLASS FRIT FOR DIFFUSION LAYER FOR USE IN ORGANIC LED ELEMENT, AND METHOD FOR PRODUCTION OF DIFFUSION LAYER FOR USE IN ORGANIC LED ELEMENT

(75) Inventors: Yumiko Aoki, Tokyo (JP); Naoya Wada, Tokyo (JP); Nobuhiro Nakamura, Tokyo (JP); Yasuko Osaki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/447,032

(22) Filed: Apr. 13, 2012

(65) Prior Publication Data

US 2012/0194065 A1 Aug. 2, 2012

Related U.S. Application Data

(63) Continuation of application No. PCT/JP2010/068094, filed on Oct. 14, 2010.

(30) Foreign Application Priority Data

Oct. 15, 2009 (JP) .................................. 2009-238674
Apr. 30, 2010 (JP) .................................. 2010-105714

(51) Int. Cl.
*H01L 51/00* (2006.01)

(52) U.S. Cl.
USPC ............................................ 313/504; 313/512

(58) Field of Classification Search
USPC .................................................. 313/498–512
See application file for complete search history.

(56) References Cited

U.S. PATENT DOCUMENTS

2009/0153972 A1* 6/2009 Nakamura et al. ............ 359/599

FOREIGN PATENT DOCUMENTS

| JP | 08-083688 A | 3/1996 |
| JP | 2004-087420 | 3/2004 |
| WO | WO-2009/017035 A1 | 2/2009 |
| WO | WO-2009/060916 A1 | 5/2009 |
| WO | WO-2009/116531 A1 | 9/2009 |

OTHER PUBLICATIONS

International Search Report in PCT/JP2010/068094 dated Dec. 7, 2010.

* cited by examiner

*Primary Examiner* — Anne Hines
(74) *Attorney, Agent, or Firm* — Foley & Lardner LLP

(57) ABSTRACT

The present invention relates to an organic LED element sequentially including: a transparent substrate; a scattering layer; a first electrode; an organic layer; and a second electrode, in which the scattering layer includes a first glass material and a second glass material dispersed in the first glass material and having a different refractive index from the first glass material.

14 Claims, 10 Drawing Sheets

US 8,525,403 B2

ORGANIC LED ELEMENT, GLASS FRIT FOR DIFFUSION LAYER FOR USE IN ORGANIC LED ELEMENT, AND METHOD FOR PRODUCTION OF DIFFUSION LAYER FOR USE IN ORGANIC LED ELEMENT

TECHNICAL FIELD

The present invention relates to an organic LED element, a glass frit for a scattering layer of an organic LED element, and a method for manufacturing a scattering layer of an organic LED element.

BACKGROUND ART

Organic LED elements include an organic light emitting layer. There is a bottom emission type or a double-side emission type that extracts light, which is generated by an organic light emitting layer, outside from a transparent substrate, in organic LED elements.

The amount of light that can be extracted to the outside from organic LED element is not more than 20% of the light emission at present.

Therefore, there is a document that describes improving light extraction efficiency by providing a scattering layer comprising a glass material in an organic LED element (Patent Document 1).

BACKGROUND ART DOCUMENT

Patent Documents

Patent Document 1: WO 09/017035 pamphlet

SUMMARY OF THE INVENTION

Problems that the Invention is to Solve

However, since bubbles are used as scattering materials in Patent Document 1, it is difficult to keep the size or distribution of the scattering materials uniform, and non-uniformity may be generated in reproducibility of the element characteristics, in mass production.

The present invention has been made in consideration of the problems and has an object to provide an organic LED element having high emission efficiency and high reproducibility of element characteristics and a glass frit for the scattering layer.

Means for Solving the Problems

In order to solve the above-mentioned problems, an organic LED element of the present invention sequentially comprises:
 a transparent substrate;
 a scattering layer;
 a first electrode;
 an organic layer; and
 a second electrode,
wherein the scattering layer includes a first glass material and a second glass material dispersed in the first glass material and having a different refractive index from the first glass material.

Also, other organic LED element of the present invention sequentially comprises:
 a transparent substrate;
 a scattering layer;
 a first electrode;
 an organic layer; and
 a second electrode,
wherein the scattering layer includes a first glass material and a second glass material dispersed in the first glass material and having a different refractive index from the first glass material, and
the scattering layer contains, in terms of mol % on the basis of oxides, $B_2O_3$ of 15~63%, $Bi_2O_3$ of 10~37%, ZnO of 10~50%, $SiO_2$ of 0~20%, $Al_2O_3$ of 0~10%, $P_2O_5$ of 0~20%, $ZrO_2$ of 0~5%, $Gd_2O_3$ of 0~10%, $TiO_2$ of 0~13%, the sum of $Li_2O$, $Na_2O$ and $K_2O$ of 0~2%, and the sum of MgO, CaO, SrO and BaO of 0~10%.

A glass frit for a scattering layer of an organic LED element of the present invention, comprises at least powder of first glass and powder of second glass,
wherein the first glass has a refractive index of 1.80 or more which is measured at 25° C. by d line of a He lamp (wavelength of 587.6 nm),
the second glass contains $SiO_2$ or $B_2O_3$ of which the contents are larger and $Bi_2O_3$ of which the content is smaller than the first glass in terms of mol % on the basis of oxides, and
a ratio of the powder of the first glass in the glass fit is 70~99 volume %.

Additionally, a glass fit for a scattering layer of an organic LED element of the present invention, comprises at least powder of first glass and powder of second glass,
wherein the first glass has a refractive index of 1.80 or more which is measured at 25° C. by d line of a He lamp (wavelength of 587.6 nm),
the second glass contains $SiO_2$ or $B_2O_3$ of which the contents are larger and $Bi_2O_3$ of which the content is smaller than the first glass in terms of mol % on the basis of oxides, and
a ratio of the powder of the first glass in the glass frit is 15~99 volume %.

Advantage of the Invention

According to the present invention, it is possible to provide an organic LED element having high emission efficiency and high reproducibility of element characteristics, and a glass frit for the scattering layer of the organic LED element.

MODE FOR CARRYING OUT THE INVENTION

Embodiments of the present invention are described hereafter with reference to the drawings. The following embodiments are provided as examples and may be modified in various ways without departing from the scope of the present invention.

(Organic LED Element)

Figure 1:
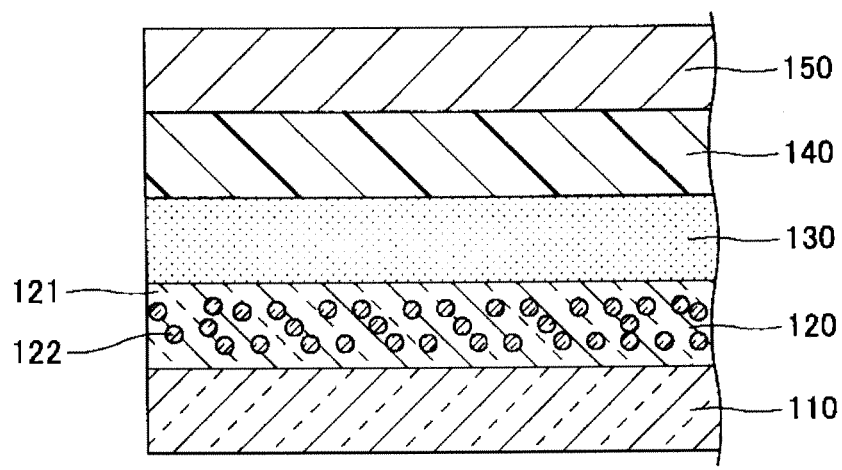
FIG. 1 is a cross-sectional view showing an example of an organic LED element of the present invention.

FIG. 1 is a cross-sectional view showing an example of an organic LED element of the present invention.

In the example shown in FIG. 1, an organic LED element is a bottom emission type organic LED element and includes, sequentially, a transparent substrate 110, a scattering layer 120, a first electrode 130, an organic layer, 140, and a second electrode 150. The first electrode 130 is a transparent electrode (anode) and has transparency to transmit light emitted from the organic layer 140 to the scattering layer 120. The second electrode 150 is a reflective electrode (cathode) and has reflectivity for reflecting the light emitted from the organic layer 140 to returning the light to the organic layer 140.

In the example shown in FIG. 1, although the first electrode 130 is an anode and the second electrode 150 is a cathode, the first electrode 130 may be a cathode and the second electrode 150 may be an anode.

Figure 2:
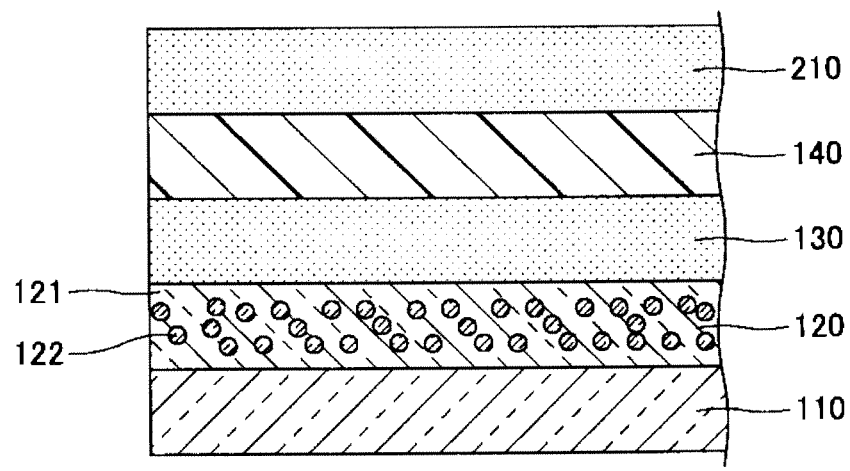
FIG. 2 is a cross-sectional view showing another example of an organic LED element of the present invention.

FIG. 2 is a cross-sectional view showing another example of an organic LED element of the present invention. The same components as those in FIG. 1 are given the same reference numerals in FIG. 2 and not described.

In the example shown in FIG. 2, an organic LED element is a double-side emission type organic LED element and includes, sequentially, a transparent substrate 110, a scattering layer 120, a first electrode 130, an organic layer, 140, and a second electrode 210. The organic LED element includes a transparent electrode that is the second electrode 210, instead of a reflective electrode that is the second electrode 150 shown in FIG. 1. The second electrode 210 transmits the light emitted from the organic layer 140 to the surface opposite to the surface facing the organic layer 140. The organic LED element is used for lighting in which light is emitted from both front and rear sides.

Each component of the organic LED element shown in FIG. 1 is described in detail hereafter as a representative example.

(Transparent Substrate)

The transparent substrate 110 comprises a material having high transmittance for the visible light, such as glass or plastic. The transparent substrate 110 usually comprises a soda-lime glass. Common soda-lime glass has an average linear expansion coefficient of about $87 \times 10^{-7}/°C$. at $50°C.\sim 300°C$. (hereafter, simply referred to as an "average linear expansion coefficient") and an annealing point of about 550° C. The transparent substrate 110 comprising a soda-lime glass may be deformed by heat treatment at a temperature of 550° C. or more, such that it is preferable to form the scattering layer 120 and the like at a temperature less than 550° C.

The transparent substrate 110 generally has a thickness of 0.1 mm-2.0 mm. When the glass substrate that is the transparent substrate 110 is thin, strength thereof may be insufficient. It is preferable that the glass substrate that is the transparent substrate 110 has a thickness of 0.5 mm~1.0 mm.

The scattering layer 120 is formed on the transparent substrate 110. Surface treatment, such as silica coating, may be applied to the scattering layer-forming surface on the transparent substrate 110. That is, a silica film may be formed between the transparent substrate 110 and the scattering layer 120.

(Scattering Layer)

The scattering layer 120 is disposed between the transparent substrate 110 and the first electrode 130.

When the first electrode 130 is formed on the transparent substrate 110 without the scattering layer 120 therebetween, generally, the transparent substrate 110 is lower in refractive index than the first electrode 130, such that light that travels at a small angle into the transparent substrate 100 is totally reflected to the organic layer 140 by Snells's law. The totally reflected light is reflected again from the reflective electrode, which is the second electrode 150, and reaches again the transparent substrate 110. At this time, if the re-incident angle to the transparent substrate 110 is not changed, the light cannot be extracted from the organic LED element.

In the example shown in FIG. 2, the second electrode 210 is required to be transparent, such that the second electrode 210 comprises ITO, similar to the first electrode 130. However, generally, a transparent conductor has a high refractive index, such that light is reflected by total reflection when the light travels at a small angle into a transparent electrode. Therefore, light extraction efficiency is reduced, unless the scattering layer 120 is provided, due to the same reason as that in the example shown in FIG. 1.

On the contrary, in the embodiment, since the scattering layer 120 is disposed between the transparent substrate 110 and the first electrode 130, it is possible to change re-incident angle to the transparent substrate 110 and to increase light extraction efficiency of the organic LED element.

The scattering layer 120, as shown in FIG. 1, is formed by distributing a second glass material 122 having a different refractive index from a first glass material 121, in the first glass material 121. That is, the portions having the first glass composition and the portions having the second glass composition are dispersed in the scattering layer 120. Since the portions having different compositions are dispersed, diffusion characteristics are excellent. Further, since the entire is composed of a glass, flatness and transparency of the surface can be implemented to be reproducible. Therefore, according to the scattering layer 120 of the present invention, it is possible to implement very efficient extraction of light to be reproducible, by using the scattering layer at a light emission side, such as a light emitting device. Further, when there are local unevenness on the surface without flatness and smoothness, the concave and convex may cause a short between electrodes of the organic LED.

The second glass material 122 is not limited to one kind and a plurality of kinds may be possible. That is, the scattering layer 120 may be formed by distributing a plurality of kinds of glass materials having different refractive indexes from the first glass material 121, in the first glass material 121.

It is preferable that the refractive index of the first glass material 121 (hereafter, referred to as a "base material 121") is equal to or higher than the refractive index of the first electrode 130. This is because when the refractive index of the base material 121 is low, a loss is generated by total reflection on the interface between the scattering layer 120 and the first electrode 130, such that the light extraction efficiency is reduced. The refractive index of the base material 121 has only to be higher in some parts (for example, red, blue, green or the like) within the emission spectrum range of the organic layer 140, preferably higher throughout the entire emission spectrum range (430 nm~650 nm), and more preferably higher throughout the entire wavelength range (360 nm~830 nm) of the visible light. If not specifically stated, the "refractive index" means a refractive index measured at 25° C. by d line of a He lamp (wavelength of 587.6 nm) in the following description.

The refractive index of the base material 121 may be lower than the refractive index of the first electrode 130, as long as the difference from the refractive index of the first electrode 130 is within 0.2.

It is preferable that the difference of the refractive indexes between the second glass material 122 (hereafter, referred to as "scattering material 122") and the base material 121 is 0.2 or more at least at a predetermined section in the emission spectrum range of the light emission layer. In order to achieve sufficient scattering characteristics, it is preferable that the difference of the refractive index is 0.2 or more throughout of the entire emission spectrum range (430 nm~650 nm) or the entire wavelength range of the visible light (360 nm~830 nm).

It is preferable that the refractive index of the scattering material 122 is 0.05 or more smaller than the refractive index of the base material 121, at least at a portion of the emission spectrum range of the light emission layer. In order to achieve sufficient scattering characteristics, it is more preferable that the refractive index of the scattering material 122 is 0.05 or more smaller than the refractive index of the base material 121, throughout the entire emission spectrum range (430 nm~650 nm) or the entire wavelength range of the visible light (360 nm~830 nm). In order to achieve scattering property, it may be possible to use a glass having a refractive index larger than the base material 121 as the scattering material 122, but a glass having a very high refractive index should be used as the scattering material 122, because it is preferable that the refractive index of the base material 121 is equal to or higher than the refractive index of the first electrode 130. In general, it is necessary to use an expensive raw material in order to achieve the glass. Further, such a glass may become unstable or may be unprofitably colored.

It is preferable that the scattering material 122 has a ratio of 1~85 volume % in the scattering layer 120. When the scattering material is less than 1 volume %, a sufficient scattering effect is not achieved and the light extraction efficiency is also less achieved. More preferably, the scattering material is 20 volume % or more. When the scattering material is too much than 85 volume %, there is a concern that the light extraction efficiency may be reduced. More preferably, the scattering material is 80 volume % or less. Further preferably, the scattering material is 30 volume % or less.

The ratio of the scattering material 122 to the scattering layer 120 means the sum of the ratios of all of scattering materials, if several kinds of scattering materials are dispersed in the scattering layer 120.

Although the shape of the scattering materials 122 is not specifically limited, when the scattering materials 122 are formed in spherical shapes, it is preferable that the average of the diameter thereof is 0.1~10 μm. When the average is smaller than 0.1 μm, the scattering materials cannot sufficiently function as light scattering materials. When the average is larger than 10 μm, the scattering materials are not easily dispersed uniformly throughout the scattering layer 120, such that the light extraction efficiency becomes ununiform. The scattering property reduces at the portions where the number of scattering materials 122 is relatively small. The ratio of the scattering materials 122 having the maximum length of 10 μm or more is preferably 15 volume % or less, more preferably 10 volume % or less.

The first electrode 130 is formed on the scattering layer 120. The surface roughness Ra of the first electrode-forming surface on the scattering layer 120 is preferably 30 nm or less, more preferably 10 nm or less, and particularly preferably 1 nm or less. When the surface roughness exceeds 30 nm, the flatness of the first electrode 130 or the organic layer 140 is deteriorated, and a short may be generated between the first electrode 130 and the second electrode 150. The surface roughness Ra is microscopic surface roughness, which is a value that a long wavelength cutoff value λc of a profile filter prescribed in JIS B 0601-2001 is regarded as 10 μm, and for example, is measured by an AFM (Atomic Force Microscope).

(First Electrode)

The first electrode (anode) 130 requires translucency of 80% or more to extract light generated from the organic layer 140. Additionally, in order to inject many holes, high work function is required. Specifically, materials, such as ITO (Indium Tin Oxide), $SnO_2$, ZnO, IZO (Indium Zinc Oxide), AZO (ZnO—$Al_2O_3$: zinc oxide doped with aluminum), GZO (ZnO—$Ga_2O_3$: zinc oxide doped with gallium), Nb-doped $TiO_2$ and Ta-doped $TiO_2$ are used.

It is preferable the first electrode 130 has a thickness of 100 nm~1 μm. When the thickness is larger than 1 μm, the transparent substrate 110 bends or transmittance reduces. On the other hand, when the thickness is less than 100 nm, electric resistance increases.

The refractive index of the first electrode 130 is generally 1.9~2.2. It may be possible to increase the carrier concentration of ITO in order to reduce the refractive ratio of ITO, which is the first electrode 130. In detail, it is possible to decrease the refractive index of ITO by increasing the concentration of Sn in ITO. However, when the concentration of Sn increases, mobility and transmittance decrease, such that it is necessary to determine the concentration of Sn by taking balance of the properties.

The organic layer 140 is formed on the first electrode 130.

(Organic Layer)

The organic layer 140 is a layer having a light emission function and, for example, composed of a hole injection layer, a hole transport layer, a light emission layer, an electron transport layer, and an electron injection layer.

The hole injection layer requires a low difference in ionization potential in order to reduce a hole injection barrier from both electrodes. The driving voltage of the element is decreased and the injection efficiency of charge is increased by improving the injection efficiency of charge from the electrode interface in the hole injection layer. Polyethylene dioxythiophene (PEDOT: PSS) doped with polystyrene sulfonic acid (PSS) is widely used for a macromolecule and phthalocyanine-based copper phthalocyanine (CuPc) is widely used for a low molecule.

The hole transport layer transports holes injected from the hole injection layer to the light emission layer. The hole transport layer is required to have appropriate ionization potential and hole mobility. Specifically, as the hole transport layer, triphenylamine derivative, N,N'-bis(1-naphtyl)-N,N'-dyphenyl-1,1'-biphenyl-4,4'-diamine (NPD), N,N'-dyphenyl-N,N'-bis[N-phenyl-N-(2-naphtyl)-4'-amino biphenyl-4-yl]-1,1'-biphenyl-4,4'-diamine (NPTE), 1,1-bis(di-4-tolylamine)phenyl]cyclohexane (HTM2), and N,N'- dyphenyl-N,N'-bis(3-methylephenyl)-1,1'-dyphenyl-4,4'-diamine (TPD), or the like may be used. It is preferable that the hole transport layer has a thickness of 10 nm~150 nm. As the less the thickness, the more the voltage can be reduced, but it is preferable that the thickness is 10 nm~150 nm because of a short between electrodes.

The light emission layer provides a place where the injected electrons and holes are recombined, and is made of a material having high emission efficiency. In detail, the emission host material and the doping material of an emission coloring material that are used for the light emission layer function as the center of recombination of the holes and electrodes injected from the anode and the cathode. Further, doping the host material with an emission color material in the light emission layer achieves high emission efficiency and changes the emission wavelength. The materials are required to have an appropriate energy level for charge injection and high chemical stability or heat resistance, and to form a uniform amorphous thin film. It is also required that the kind of the color purity of the emission color is excellent or the emission efficiency is high. The emission material that is an organic material includes low-molecular materials and high-molecular materials. These materials are classified into a fluorescent material and a phosphorescent material in accordance with the emission mechanism. Specifically, as the light emission layer, metal complex of a quinolinic derivative, such as tris(8-quinolinorate) aluminum complex (Alq3), bis(8-hydroxy) quinaldine aluminum phenoxide (Alq'2OPh), bis(8-hydroxy) quinaldine aluminum-2,5-dimethly phenoxide (BAlq), mono(2,2,6,6-tetramethyl-3,5-heptanedionate) lithium complex (Liq), mono(8-quinolinorate) natrium complex (Naq), mono(2,2,6,6-tetramethyl-3,5-heptanedionate) lithium complex, mono(2,2,6,6-tetramethyl-3,5-heptanedionate) natrium complex, and bis(8-quinolinorate) calcium complex (Caq2), or a fluorescent material, such as, tetraphenylbutadiene, phenylquinacridone (QD), anthracene, perylene, and coronene may be mentioned. As the host material, quinolinorate complex is preferable, and particularly, aluminum complex with 8-quinolinol and the derivative as a ligand is preferable.

The electron transport layer transports the electrons injected from the electrode. As the electron transport layer, quinolinol aluminum complex (Alq3), oxydiazol derivative (for example, 2,5-bis(1-naphtyl)-1,3,4-oxydiazol (BND) and 2-(4-t-butylphenyl)-5-(4-biphenyl)-1,3,4-oxidiazol (PBD) or the like), triazole derivative, Bathophenanthroline derivative, silole derivative, or the like may be used.

The electron injection layer is required to increase the injection efficiency of electrons. In the electron injection layer, in detail, a layer doped with alkali metal, such as lithium (Li) or cesium (Cs), is disposed on the cathode interface.

The refractive index of the organic layer 140 is generally 1.7~1.8.

The second electrode 150 is formed on the organic layer 140.

(Second Electrode)

The second electrode (cathode) 150 requires reflectivity, such that, metal with a small work function or an alloy of the metal is used. Specifically, as the second electrode 150, alkali metal, alkali earth metal, and the metal in the third group in the periodic table may be mentioned. Of these, aluminum (Al), magnesium (Mg), silver (Ag), or alloys thereof are preferably used, since these materials are inexpensive and have high chemical stability. A stacked electrode formed by depositing Al on a co-deposited film of Al and MgAG, or a thin deposited film of LiF or $Li_2O$. In the high-molecular system, stack of calcium (Ca) or barium (Ba) and aluminum (Al) is used.

(Glass of Scattering Layer)

It is preferable that the glass of the scattering layer 120 is a glass that is softened by heat treatment at a low temperature of 550° C. or less. For this configuration, it is preferable that the glass transition point of the glass of the scattering layer 120 is 500° C. or less. Accordingly, it is possible to prevent thermal deformation of the soda-lime glass substrate that is the transparent substrate 110.

Further, the average linear expansion coefficient of the glass of the scattering layer 120 is preferably $60\sim100\times10^{-7}/°$ C., and more preferably $65\sim90\times10^{-7}/°$ C. Therefore, it is possible to reduce the difference of the average linear expansion coefficients of the scattering layer 120 and the soda-lime glass substrate that is the transparent substrate 110, such that it is possible to prevent bending or breaking during heating or cooling.

Further, it is preferable that the refractive index of the glass of the scattering layer 120 is 1.75 or more. When the refractive index is less than 1.75, a loss due to total reflection is large and the light extraction efficiency is easily reduced, at the interface of the scattering layer 120 and the fist electrode 130. Further, it is preferable that the refractive index is 2.20 or less. When the refractive index is larger than 2.20, total reflection easily occurs in a short wavelength region, between the scattering layer 120 and the transparent substrate 110, such that the light extraction efficiency may be reduced.

As such a glass, $SiO_2$—$B_2O_3$—$Bi_2O_3$—ZnO-based glass or $B_2O_3$—$Bi_2O_3$—ZnO-based glass may be mentioned.

It is preferable that the glass of the scattering layer 120 contains, in terms of mol % on the basis of oxides, $B_2O_3$ of 15~63%, $Bi_2O_3$ of 10~37%, ZnO of 6~50%, $SiO_2$ of 0~20%, $Al_2O_3$ of 0~10%, $P_2O_5$ of 0~20%, $ZrO_2$ of 0~5%, $Gd_2O_3$ of 0~10%, $TiO_2$ of 0~13%, the sum of alkali metal oxides of 0~2%, and the sum of alkali earth metal oxides of 0~10%.

The glass composition is described next. Incidentally, "%" means mol % in the following description.

$B_2O_3$ is an essential component that can increase stability of glass. It is preferable that the content of $B_2O_3$ is 15~63%. When the content is less than 15%, the effect is not sufficient. On the other hand, when the content exceeds 63%, water resistance is reduced. It is more preferable that the content of $B_2O_3$ is 15~55%.

$Bi_2O_3$ is an essential component that increases a refractive index and decreases viscosity. The content of $Bi_2O_3$ is preferably 10~37% and more preferably 10~28%. When the content is less than 10%, the refractive index is reduced, such that the light extraction efficiency may be reduced. On the other hand, when the content of exceeds 37%, the average linear expansion coefficient is excessively increased, such that crystallization is easily generated in a firing process.

ZnO is an essential component that stabilizes glass, decreases a glass transition point and a softening point, and increases a refractive index. The content of ZnO is preferably 6~50% and more preferably 14~50%. When the content is less than 6%, devitrification is easily generated in forming of glass, such that the refractive index may be reduced. Further, crystallization is easily generated in firing after fitting. When a crystalline is generated, the light transmittance of the scattering layer 120 is reduced or the surface flatness and smoothness of the scattering layer 120 becomes insufficient. When the content of ZnO exceeds 50%, the average linear expansion coefficient excessively increases and devitrification is easily generated when glass is formed. Further, acid resistance is reduced. Etching is generally performed with acid when patterning the first electrode 130, but when the acid resistance of the scattering layer 120 is reduced, the scattering layer 120 is also corroded and may lose surface flatness and smoothness.

$SiO_2$ is an optional component that increases stability of glass and decreases the average linear expansion coefficient. The content of $SiO_2$ is preferably 0~20% and more preferably 0.1~14%. When the content exceeds 20%, the refractive index may be excessively decreased.

$Al_2O_3$ is an optional component that increases stability of glass. It is preferable that the content of $Al_2O_3$ is 0~10%. When the content exceeds 10%, devitrification is easily generated in forming of glass, such that the refractive index may be excessively reduced.

$P_2O_5$ is a component that becomes the network former of glass and an optional component that improves acid resistance. It is preferable that the content of $P_2O_5$ is 0~20%. When the content exceeds 20%, devitrification may be easily generated in forming of glass and the glass may be easily crystallized in firing after fitting. The refractive index also decreases.

$ZrO_2$ is an optional component that increases weather resistance and stability of glass. It is preferable that the content of $ZrO_2$ is 0~5%. When the content exceeds 5%, crystallization is easily generated and the glass transition point may excessively increase.

$Gd_2O_3$ is an optional component that increases a refractive index while keeping an average linear expansion coefficient low. It is preferable that the content of $Gd_2O_3$ is 0~10%. When the content exceeds 10%, the glass transition point and the softening point may increase.

$TiO_2$ is an optional component that increases a refractive index. It is preferable that the content of $TiO_2$ is 0~13%. When the content exceeds 13%, crystallization is easily generated and the glass transition point and the softening point may increase.

The alkali metal oxides ($Li_2O$, $Na_2O$, $K_2O$) are all optional components that decrease viscosity of glass and are used independently or together with each other. The sum of the content of the alkali metal oxides ($Li_2O$, $Na_2O$, $K_2O$) is preferably 6% or less and more preferably 2% or less. When the content exceeds 2%, the average linear expansion coefficient increases, such that the transparent substrate 110 may be easily deformed in a heat treatment process or the element may be adversely affected by diffusion of alkali. It is more preferable not to practically contain alkali metal oxides.

Alkali earth metal oxides (MgO, CaO, SrO, and BaO) are optional component that decrease viscosity of glass. It is preferable that the sum of the contents of the alkali earth metal oxides is 0~10%. When the sum of the contents exceeds 10%, the average linear expansion coefficient may increase and the refractive index may decrease. It is more preferable that the content of the alkali earth metal oxides is 7% or less.

The base material glass may contain a small amount of colorant to adjust the tint of emitted light. Those known in the art, such as a transition metal oxide, a rare-earth metal oxide, or metal colloid, are appropriately used as the colorant. The colorants may be used independently or together with each other.

The glass of the scattering layer 120 has a composition distribution and is a glass formed by distributing a second phase made of a second glass material 122 in a first phase made of a first glass material 121. The second glass material 122 has a refractive index different from the first glass material 121, preferably, a refractive index lower than that of the first glass material 121. As the second glass material 122 having a refractive index lower than the first glass material 121, a glass containing $SiO_2$ or $B_2O_3$ of which the contents are larger and $Bi_2O_3$ of which the content is smaller than the first glass material 121 in terms of mol % on the basis of oxides.

(Base Material Glass)

It is preferable that the base material glass has a refractive index of 1.80 or more. This is because when the refractive index of the base material glass is lower than 1.80, a loss is easily generated by total reflection at the interface between the scattering layer 120 and the first electrode 130, such that the light extraction efficiency is easily reduced. Further, it is preferable that the refractive index is 2.20 or less. When the refractive index exceeds 2.20, total reflection is easily generated in the short wavelength region and the tint of the extracted light is easily changed from the color of the original emitted light, between the scattering layer 120 and the transparent substrate 110.

It is preferable that the base material glass is a glass that is not easily crystallized. When crystallization is easy, the light transmittance of the scattering layer 120 is reduced or the surface flatness and smoothness of the scattering layer 120 becomes insufficient.

Further, the average linear expansion coefficient of the glass of the base material glass is preferably $60~100\times10^{-7}$/° C., and more preferably $65~90\times10^{-7}$/° C. Therefore, it is possible to reduce the difference of the average linear expansion coefficients of the soda-lime glass substrate that is the transparent substrate 110, such that it is possible to prevent bending or breaking during heating or cooling.

It is preferable that the base material glass is a glass that is softened by heat treatment at a low temperature of 550° C. or less. For this configuration, it is preferable that the glass transition point of the base material glass is 500° C. or less. Accordingly, it is possible to prevent thermal deformation of the soda-lime glass substrate that is the transparent substrate 110.

In order to satisfy these conditions, the base material glass contains, in terms of mol % on the basis of oxides, $B_2O_3$ of 15~63%, $Bi_2O_3$ of 10~37%, ZnO of 5~50%, $SiO_2$ of 0~20%, $Al_2O_3$ of 0~10%, $P_2O_5$ of 0~20%, $ZrO_2$ of 0~5%, $Gd_2O_3$ of 0~10%, $TiO_2$ of 0~15%, the sum of alkali oxides ($Li_2O$, $Na_2O$, and $K_2O$) of 0~2%, an the sum of alkali earth metal oxides (MgO, CaO, SrO, and BaO) of 0~10%, in which the value obtained by dividing the content of $P_2O_5$ by the content of ZnO is less than 0.48, the sum of the contents of $P_2O_5$ and $B_2O_3$ is 30~60%, and the content of $P_2O_5$ is 10% or less when the sum of the contents of $P_2O_5$ and $B_2O_3$ exceeds 50%.

The glass composition is described next. Incidentally, "%" means mol % in the following description.

When the content of $B_2O_3$ is less than 15%, devitrification may be easily generated in forming of glass and the glass may be easily crystallized in firing after fritting. When the content of $B_2O_3$ exceeds 63%, water resistance is reduced. The content of $B_2O_3$ is preferably 15~60% and more preferably 15~55%.

When the content of $Bi_2O_3$ is less than 10%, the refractive index of the scattering layer 120 is excessively reduced. On the other hand, when the content of $Bi_2O_3$ exceeds 37%, the average linear expansion coefficient is excessively increased and crystallization is easily generated in the firing process. It is more preferable that the content of $Bi_2O_3$ is 15~28%.

When the content of ZnO is less than 5%, the devitrification is easily generated in forming of glass and the glass transition point of the glass increases, such that it is difficult to achieve flatness and smoothness of a frit-fired film. Additionally, since the refractive index thereof decreases, it is not preferable. When the content of ZnO exceeds 50%, the average linear expansion coefficient increases and devitrification is easily generated in forming of glass. The weather resistance may be deteriorated. It is preferable that the content of ZnO is 20~50%.

$SiO_2$ is an optional component that increases stability of glass, prevents crystallization in a firing process, and decreases the average linear expansion coefficient. It is preferable that the content of $SiO_2$ is 0~20%. When the content exceeds 20%, the refractive index may be excessively decreased.

$Al_2O_3$ is an optional component that increases stability of glass. It is preferable that the content of $Al_2O_3$ is 0~10%. When the content exceeds 10%, devitrification may be generated in forming of glass.

$P_2O_5$ is an optional component that improves acid resistance and stabilizes glass. It is preferable that the content of $P_2O_5$ is 0~20%. When the content exceeds 20%, devitrification may be easily generated in forming of glass and the glass may be easily crystallized in firing after fritting. The refractive index also decreases.

$ZrO_2$ is an optional component and it is preferable that the content of $ZrO_2$ is 0~5%. When the content exceeds 5%, crystallization is easily generated and the glass transition point may excessively increase.

$Gd_2O_3$ is an optional component that increases the refractive index while keeping the average linear expansion coefficient low, and prevents crystallization around the softening point. It is preferable that the content of $Gd_2O_3$ is 0~10%. When the content exceeds 10%, crystallization is easily generated and the glass transition point and the softening point may increase.

$TiO_2$ is not essential but a component that increases the refractive index and may be contained. However, when the content is too large, crystallization is easily generated and the glass transition point and the softening point may increase. It is preferable that the content of $TiO_2$ is 0~15%. It may be possible to use $WO_3$, instead of (or in addition to) $TiO_2$. It is preferable that the sum of the contents of $TiO_2$ and $WO_3$ is 0~12%.

The alkali metal oxides ($Li_2O$, $Na_2O$, $K_2O$) are all optional components that decrease viscosity of glass and are used independently or together with each other. The sum of the content of the alkali metal oxides ($Li_2O$, $Na_2O$, $K_2O$) is preferably 2% or less. When the sum of the contents exceeds 2%, the average linear expansion coefficient increases, such that the transparent substrate may be easily deformed in a heat treatment process or the element may be adversely affected by diffusion of alkali. It is more preferable not to practically contain alkali metal oxides.

Alkali earth metal oxides (MgO, CaO, SrO, and BaO) are optional components that decrease viscosity of glass. It is preferable that the sum of the contents of the alkali earth metal is 0~10%. When the sum of the contents exceeds 10%, the average linear expansion coefficient may increase and the refractive index may decrease. It is more preferable that the content of the alkali earth metal is 0~7%.

It is preferable that the value obtained by dividing the content of $P_2O_5$ by the content of ZnO is less than 0.48. Devitrification is easily generated at 0.48 or more, such that crystallization may be easily generated. The refractive index decreases at 0.48 or more and the glass transition point and the softening point may increase.

It is preferable that the sum of the contents of $P_2O_5$ and $B_2O_3$ is 30~60%. When the sum of the contents is less than 30%, devitrification is easily generated and crystallization is easily generated, such that stability may be influenced. On the other hand, when the sum of the contents exceeds 60%, devitrification is generally generated, crystallization is easily generated and the refractive index may decrease. When the sum of the contents of $P_2O_5$ and $B_2O_3$ exceeds 50%, it is preferable that the content of $P_2O_5$ is 10% or less. When the sum of the contents exceeds 10%, devitrification is easily generated and crystallization is easily generated.

It may be possible to add a small amount colorant to the base material glass to adjust the tint of emitted light. The colorant may be that known in the art, such as a transition metal oxide, a rare-earth metal oxide, or metal colloid. The colorants may be used independently or together with each other.

The base material glass may be obtained by weighing raw materials, such as an oxide, phosphate, metaphosphate, carbonate, nitrate, or hydroxide, mixing the raw materials, dissolving the mixture at a temperature of 900~1400° C. with a melting pot of platinum or the like, and cooling the solution. Powder of base material glass can be obtained by milling the obtained base material glass with a mortar, a ball mill, or a jet mill, and classifying the glass, if necessary. The surface of the powder of the base material glass may be modified by a surfactant or a silane coupling agent.

(Scattering Material Glass)

It is preferable that the scattering material glass, as described above, is a glass of which the refractive index is 0.05 or more lower than the refractive index of the base material glass, at least at a portion of the emission spectrum range of the light emitting layer. In order to achieve sufficient scattering characteristics, it is more preferable that the refractive index of the scattering material glass is 0.05 or more lower than the refractive index of the base material glass, throughout the entire emission spectrum range (430 nm~650 nm) or the entire wavelength range of the visible light (360 nm~830 nm).

It is preferable that the scattering material glass is a glass that is softened at the firing temperature of the base material glass. In detail, it is preferable that the glass transition point of the scattering material glass is within the range of −50° C. to +50° C. from the glass transition point of the base material glass.

The scattering material glass may be a glass in which the content of $SiO_2$ or $B_2O_3$ is larger and the content of $Bi_2O_3$ is smaller than the base material glass, in terms of mol % on the basis of oxides.

In detail, the scattering material glass may be two kinds of glass, in which one is a glass containing the sum of alkali metal oxides ($Li_2O$, $Na_2O$, and $K_2O$) of 9% or more and the other is a glass containing the sum of alkali metal oxides of 2% at most.

It is preferable that the scattering material glass containing the sum of alkali metal oxides of 9% or more contains, in terms of mol % on the basis of oxides, $SiO_2$ of 18~45%, $B_2O_3$ of 40~70%, the sum of $Li_2O$, $Na_2O$ and $K_2O$ of 9~18%, and ZnO of 0~15%.

The glass composition is described next. Incidentally, "%" means mol % in the following description.

When the content of $SiO_2$ is less than 18%, the reactivity with the base material glass is high, such that they may cause each other to easily diffuse. Further, the refractive index of the scattering material glass increases, such that the function as the scattering material is reduced. More preferably, the content is 25% or more. Further preferably, the content is 30% or more. On the other hand, when the content of $SiO_2$ exceeds 45%, the glass transition point excessively increases, and it is difficult to achieve a flat surface when the heat treatment temperature is under 550° C. More preferably, the content is 36% or less.

When the content of $B_2O_3$ is less than 40%, the glass transition point excessively increases. On the other hand, when the content of $B_2O_3$ exceeds 70%, chemical durability is remarkably reduced and bubbles that cause a defect are easily generated.

It is preferable that the sum of the contents of $B_2O_3$ and $SiO_2$ is 67~91%. More preferably, the sum of the contents is 76~88%. More preferably, the sum of the contents is 79~84%. It is preferable that the content of $B_2O_3$ is 52% or more in order to decrease the firing temperature. It is preferable that the content of $B_2O_3$ is 30% or more in order to increase the chemical durability.

The glass transition point excessively increases, when the sum of the contents of $Li_2O$, $Na_2O$ and $K_2O$ is lower than 9%. On the other hand, when the sum of the contents of $Li_2O$, $Na_2O$ and $K_2O$ exceeds 18%, the reactivity with the base material glass is high, such that the glass substrate may be deformed or the element may be adversely affected by diffusion of alkali components.

ZnO is a component that increases stability of glass and when the content exceeds 15%, the glass transition point excessively increases, and it is difficult to achieve a flat surface when the heat treatment temperature is under 550° C.

The scattering material glass may contain the sum of MgO, CaO, SrO and BaO, up to 15% in order to increase stability or adjust the refractive index or the average linear expansion coefficient of glass.

The glass of the scattering material glass containing the sum of alkali metal oxides of 2% at most contains, in terms of mol % on the basis of oxides, $B_2O_3$ of 15~55%, $Bi_2O_3$ of 10~28%, ZnO of 10~50%, $SiO_2$ of 0~20%, $Al_2O_3$ of 0~10%, $P_2O_5$ of 0~20%, $ZrO_2$ of 0~5%, $Gd_2O_3$ of 0~10%, $TiO_2$ of 0~5%, the sum of alkali metal oxides ($Li_2O$, $Na_2O$ and $K_2O$) of 0~2%, and the sum of alkali earth metal oxides (MgO, CaO, SrO and BaO) of 0~10%.

The glass composition is described next. Incidentally, "%" means mol % in the following description.

When the content of $B_2O_3$ is less than 15%, devitrification may be easily generated in forming of glass. On the other hand, when the content of $B_2O_3$ exceeds 55%, chemical durability is remarkably reduced and bubbles that cause a defect are easily generated.

$Bi_2O_3$ is an essential component and it is preferable that the content of $Bi_2O_3$ is 10~28%. When the content is less than 10%, the glass transition point and the softening point increase, such that sufficient softening may not be achieved at the firing temperature. On the other hand, when the content exceeds 28%, crystallization may be generated in the firing process and the refractive index may excessively increase.

ZnO is an essential component and it is preferable that the content of ZnO is 10~50%. When the content is less than 10%, devitrification is easily generated in forming of glass, such that the glass transition point may increase. On the other hand, when the content exceeds 50%, crystallization may be easily generated in firing.

$SiO_2$ is an optional component that increases stability of glass, prevents crystallization in a firing process, and decreases the average linear expansion coefficient. It is preferable that the content of $SiO_2$ is 0~20%. When the content exceeds 20%, the glass transition point may excessively increase.

$Al_2O_3$ is an optional component that increases stability of glass. It is preferable that the content of $Al_2O_3$ is 0~10%. When the content exceeds 10%, devitrification may be generated in forming of glass.

$P_2O_5$ is an optional component that increases stability and decreases a refractive index of glass. It is preferable that the content of $P_2O_5$ is 0~20%. When the content exceeds 20%, devitrification may be generated in forming of glass or crystallization may be generated in the firing process. Further, the glass transition point may excessively increase.

$ZrO_2$ is an optional component and it is preferable that the content of $ZrO_2$ is 0~5%. When the content exceeds 5%, crystallization is easily generated and the glass transition point may excessively increase.

$Gd_2O_3$ is an optional component. It is preferable that the content of $Gd_2O_3$ is 0~10%. When the content is 10% or more, crystallization is easily generated, the glass transition point and the softening point may increase, and the refractive index may excessively increase.

$TiO_2$ is an optional component and it is preferable that the content of $TiO_2$ is 0~5%. When the content exceeds 5%, the glass transition point may excessively increase and the refractive index may excessively increase.

The alkali metal oxides ($Li_2O$, $Na_2O$ and $K_2O$) are all optional components that decrease viscosity of glass and are used independently or together with each other. The sum of the content of the alkali metal oxides ($Li_2O$, $Na_2O$ and $K_2O$) is preferably 2% or less. When the content exceeds 2%, the average linear expansion coefficient increases, such that the transparent substrate may be easily deformed in a heat treatment process or the element may be adversely affected by diffusion of alkali. It is more preferable not to practically contain alkali metal oxides.

The alkali earth metal oxides are optional components that decrease viscosity of glass. It is preferable that the sum of the contents of the alkali earth metal oxides is 0~10%. When the sum of the contents exceeds 10%, the average linear expansion coefficient increases, such that the transparent substrate easily deforms in a heat treatment process.

The scattering material glass can be obtained by weighing a raw material, such as an oxide, carbonate, nitrate, or hydroxide, mixing the raw materials, dissolving the mixture at a temperature of 900~1500° C. with a melting pot of platinum or the like, and cooling the solution by injecting the solution into a mold or between a pair of rolls. Powder of scattering material glass can be obtained by pulverizing the obtained scattering material glass with a mortar, a ball mill, or a jet mill, and classifying the glass, if necessary. The surface of the powder of the scattering material glass may be modified by a surfactant or a silane coupling agent.

(Method of Manufacturing Scattering Layer)

The scattering layer 120 can be formed by mixing a glass frit, which is prepared by mixing two or more kinds of glass powders having different refractive indexes, with a vehicle to make a glass paste, coating the glass paste onto the transparent substrate 110, and firing the transparent substrate 110 with the glass paste.

(1) Glass Frit

It is preferable that the glass frit comprises at least, powder of first glass (hereafter, referred to as "base material glass") having a refractive index of 1.80 or more and powder of second glass (hereafter, referred to as "scattering material glass") having a refractive index lower than the first glass.

Figure 3:
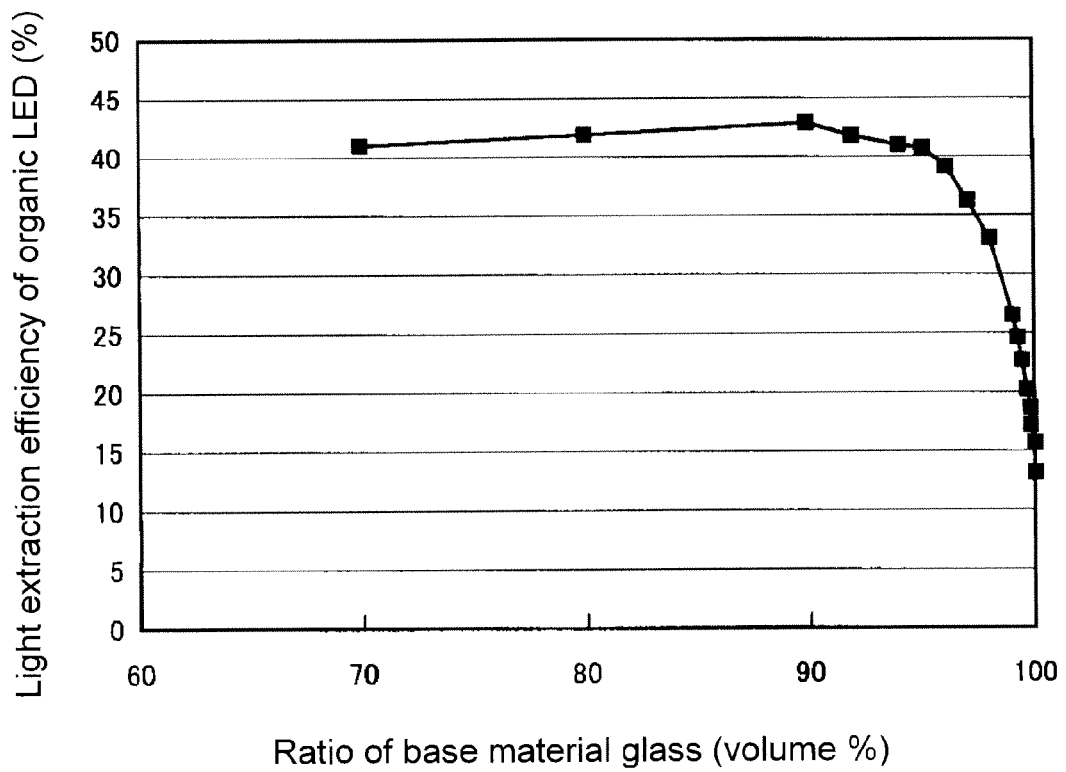
FIG. 3 is a graph showing an example of the relationship between the ratio of base material glass in a glass frit of the present invention and the light extraction efficiency of an organic LED element manufactured by using the glass fit.

FIG. 3 is a graph showing an example of the relationship between the ratio of powder of base material glass in a glass frit of the present invention and the light extraction efficiency of an organic LED element manufactured using the glass frit.

It is preferable that the ratio of the powder of the scattering material glass in the glass frit is 1~85 volume %. When the ratio is less than 1 volume %, it is difficult to achieve a sufficient scattering effect and a sufficient light extraction efficiency. More preferably, the ratio is 20 volume % or more. When the ratio exceeds 85 volume %, the light extraction efficiency may be reduced. More preferably, the ratio is 80 volume % or less, and further preferably 30 volume % or less. The ratio of the powder of the scattering material glass in the glass frit implies the sum of the ratio of the powder of all scattering material glasses, when powders of a plurality of kinds of scattering material glass are used.

In other words, it is preferable that the ratio of the powder of the base material glass in the glass frit is 15~99 volume %. When the ratio exceeds 15 volume %, the light extraction efficiency may be reduced. More preferably, the ratio is 20 volume % or more, and more preferably 70 volume % or more. When the ratio exceeds 99 volume %, it is difficult to achieve a sufficient light extraction efficiency. More preferably, the ratio is 80 volume % or less.

It is preferable that the mass average particle diameter of the glass frit is 0.1~10 μm. When the diameter is less than 0.1 μm, it is difficult to uniformly distribute the glass frit in the glass paste, which is described below, and the glass frit cannot sufficiently function as a light scattering material. On the other hand, when the diameter exceeds 10 μm, it is difficult to achieve surface flatness and smoothness of the applied-fired film.

It is preferable that the glass frit is coated on the substrate, as a glass paste kneaded with a vehicle or a solvent, in view of coatability.

(2) Glass Paste

The glass paste can be obtained by mixing the glass frit with a vehicle with a planetary mixer, and uniformly distributing the mixture. In general, the glass frit of 70~80 wt % and the vehicle of 20~30 wt % are mixed.

The vehicle is obtained by mixing a resin with a solvent.

The resin may be ethylcellulose, nitrocellulose, acrylic resin, acetic acid vinyl, butyral resin, or epoxy resin.

The solvent is used to dissolve the resin, and generally, an organic solvent having a boiling point of about 190° C. to 280° C. is used.

As the solvent, 2-(2-n-butoxyethoxy)ethanol, acetic acid 2-(2-n-butoxyethoxy)ethyl, α-terpineol and 2,2,4-trimethyl-1,3-pentanediol monoisobutyrate may be mentioned. The solvents are used together with each other in most cases.

The glass paste may contain a plasticizer, a dispersant, and the like, other than the glass frit or the vehicle.

(3) Coating

As a method of coating a glass paste onto the transparent substrate 110, screen printing doctor blade printing, die coating printing and the like are used. It may be possible to obtain a green sheet by coating and drying the glass paste on an PET film or the like, and then thermally-pressing the green sheet onto the transparent substrate 110.

When screen printing is used, it is possible to control the thickness of the glass paste film after coating by adjusting the mesh roughness of the screen plate, the thickness of the emulsion, the pressing pressure in printing, and the pressed amount of squeegee.

When doctor blade printing and die coating printing are used, as compared with when screen printing is used, it is possible to make the glass paste film thick after coating.

It is also possible to make the glass paste film thick by repeating coating and drying.

(4) Firing

A glass paste is fired on the transparent plate 110. The firing includes debinderizing treatment for decomposing the resin in the glass paste and allowing it to disappear and firing treatment for sintering and softening the glass paste after the debinderizing treatment. The firing temperature (firing process temperature) is set 40° C. or more higher than the glass transition point of the base material glass. The scattering layer 120 formed by distributing the second phase comprising scattering material glass into the first phase comprising base material glass by performing cooling to the room temperature after firing, is coated on the transparent substrate 110.

EXAMPLES

The present invention is described hereafter in detail by the following examples, but the present invention is not limited to the examples.

The glass composition in terms of mol % on the basis of oxides, refractive index $n_d$, glass transition point Tg, average linear expansion coefficient $\alpha_{50\text{-}300}$ at 50° C.~300° C., and glass softening point Ts regarding base material glass and scattering material glass of respective Examples are shown in Tables 1 to 4.

For the base material glass 1~4, and 11, in order to achieve the components expressed by mol % in the tables, bulk type of glass was obtained by weighing and mixing powder raw materials of $H_3BO_3$, ZnO, $Bi_2O_3$, $Zn(PO_3)_2$, $BaCO_3$ such that the sum thereof was 200 g, melting the mixture at a temperature of 1050° C. for one hour in a platinum melting pot, keeping melting the mixture at 950° C. for one hour and pouring a half the melt into a carbon mold, and then, flake type of glass was obtained by pouring the residue thereof between a pair of rolls. Strain was removed by putting bulk type of glass into an electric furnace at 500° C. and decreasing the temperature to the room temperature at a speed of 100° C./hr.

For the base material glass 5~10, and 12, in order to achieve the components expressed by mol % in the tables, bulk type of glass was obtained by weighing and mixing powder raw materials of $H_3BO_3$, ZnO, $Bi_2O_3$, $TiO_2$, $SiO_2$, $Al_2O_3$, $ZrO_2$, $Gd_2O_3$, and $Zn(PO_3)_2$ such that the sum thereof was 200 g, melting the mixture at a temperature of 1250° C. for one hour in a platinum melting pot, keeping melting the mixture at 1100° C. for one hour and pouring a half the molten liquid into a carbon mold, and then, flake type of glass was obtained by pouring the residue thereof between a pair of rolls. Strain was removed by putting bulk type of glass into an electric furnace at 500° C. and decreasing the temperature to the room temperature at a speed of 100° C./hr.

For the scattering material glass 1~6, in order to achieve the components expressed by mol % in the tables, bulk type of glass was obtained by weighing and mixing powder raw materials of $H_3BO_3$, ZnO, $SiO_2$, $Li_2CO_3$, $Na_2CO_3$, and $K_2CO_3$ such that the sum thereof was 150 g, melting the mixture at a temperature of 1250° C. for two hours while stirring in a platinum melting pot, and pouring a half the molten liquid into a carbon mold, and then, flake type of glass was obtained by pouring the residue thereof between a pair of rolls. Strain was removed by putting bulk type of glass into an electric furnace at 450° C. and decreasing the temperature to the room temperature at a speed of 100° C./hr.

For the scattering material glass 10 and 15, in order to achieve the components expressed by mol % in the tables, bulk type of glass was obtained by weighing and mixing powder raw materials of $H_3BO_3$, ZnO, $Bi_2O_3$, and $Zn(PO_3)_2$, such that the sum thereof was 200 g, melting the mixture at a temperature of 1050° C. for one hour in a platinum melting pot, keeping dissolving the mixture at 950° C. for one hour and pouring a half the molten liquid into a carbon mold, and then, flake type of glass was obtained by pouring the residue thereof between a pair of rolls. Strain was removed by putting bulk type of glass into an electric furnace at 500° C. and decreasing the temperature to the room temperature at a speed of 100° C./hr.

For the scattering material glass 7~9, and 14, in order to achieve the components expressed by mol % in the tables, bulk type of glass was obtained by weighing and mixing powder raw materials of $H_3BO_3$, ZnO, $Bi_2O_3$, $TiO_2$, $SiO_2$, $Al_2O_3$, $Gd_2O_3$, $Zn(PO_3)_2$, and $SrCO_3$ such that the sum thereof was 200 g, melting the mixture at a temperature of 1250° C. for one hour in a platinum melting pot, keeping melting the mixture at 1100° C. for one hour and pouring a half the molten liquid into a carbon mold, and then, flake type of glass was obtained by pouring the residue thereof between a pair of rolls. Strain was removed by putting bulk type of glass into an electric furnace at 500° C. and decreasing the temperature to the room temperature at a speed of 100° C./hr.

The refractive index $n_d$, glass transition point Tg, average linear expansion coefficient $\alpha_{50\text{-}300}$ at 50° C.~300° C., and glass softening point Ts of the thus-obtained glasses were measured as follows.

1. Refractive Index $n_d$

The glass was polished and then measured with a measurement wavelength of 587.6 nm at 25° C., using a V-block method, with a precise refractometer KPR-2000 made by Kalnew Optical Industrial Co., Ltd.

2. Glass Transition Point Tg

The glass was processed into a round bar shape having a diameter of 5 mm and a length of 200 mm and measured with the heating rate of 5° C./min, using thermal dilatometer TD5000SA made by Bruker AXS Inc.

3. Average Linear Expansion Coefficient at 50° C.~300° C. ($\alpha_{50\text{-}300}$)

The glass was processed into a round bar shape having a diameter of 5 mm and a length of 200 mm and measured with the heating rate of 5° C./min, using thermal dilatometer TD5000SA made by Bruker AXS Inc. The average linear expansion coefficient $\alpha_{50\text{-}300}$ at 50° C.~300° C. can be obtained by, $\alpha_{50\text{-}300} = \{(L_{300}/L_{50})-1\}/(300-50)$, when the length of the glass bar at 50° C. is $L_{50}$ and the length of the glass bar at 300° C. is $L_{300}$.

4. Glass Softening Point Ts

The glass was pulverized with an agate mortar, and was sifted from the particle diameter of 74 μm to 106 μm. Of these, 120 mg of the powder was put into a platinum pan, and measured with the heating rate of 10° C./min with thermal TG/DTA EXSTAR6000 made by SII NanoTechnology Inc., and a temperature at a bending point on a DTA curve following softening flow shown at a side of which the temperature is higher than the glass transition point Tg was selected as the glass softening point Ts.

TABLE 1

|  | base material 1 | base material 2 | base material 3 | base material 4 |
|---|---|---|---|---|
| $P_2O_5$ (mol %) | 17.0 | 7.4 | 0.0 | 0.0 |
| $B_2O_3$ (mol %) | 16.2 | 40.2 | 54.6 | 47.6 |
| ZnO (mol %) | 46.8 | 32.4 | 25.4 | 32.4 |
| $Bi_2O_3$ (mol %) | 20.0 | 20.0 | 20.0 | 20.0 |
| $SiO_2$ (mol %) |  |  |  |  |
| $Li_2O$ (mol %) |  |  |  |  |
| $Na_2O$ (mol %) |  |  |  |  |
| $K_2O$ (mol %) |  |  |  |  |
| Sum (mol %) | 100.0 | 100.0 | 100.0 | 100.0 |
| $P_2O_5 + B_2O_3$ (mol %) | 33.2 | 47.6 | 54.6 | 47.6 |
| $P_2O_5$ (mol %)/ZnO (mol %) | 0.36 | 0.23 | 0.00 | 0.00 |
| Refractive index ($n_d$) | 1.89 | 1.89 | 1.89 | 1.96 |
| $\alpha_{50\text{-}300}$ (×$10^{-7}$/° C.) | 88 | 81 | 76 | 76 |
| Tg (° C.) | 452 | 466 | 475 | 459 |
| Ts (° C.) | 540 | 556 | 545 | 546 |
| Specific gravity | 5.55 | 5.33 | 5.25 | 5.47 |

TABLE 2

|  | Base material 5 | Base Material 6 | Base material 7 | Base material 8 | Base material 9 | Base material 10 | Base material 11 | Base Material 12 |
|---|---|---|---|---|---|---|---|---|
| $P_2O_5$ (mol %) | — | — | — | — | — | — | — | — |
| $B_2O_3$ (mol %) | 51.5 | 33.3 | 32.8 | 34.2 | 45.1 | 30.2 | 45.8 | 32.0 |
| ZnO (mol %) | 8.6 | 13.4 | 13.1 | 13.7 | 38.4 | 12.1 | 31.2 | 12.8 |
| $Bi_2O_3$ (mol %) | 36.1 | 27.9 | 27.3 | 28.5 | 16.5 | 25.1 | 19.2 | 26.6 |
| $TiO_2$ (mol %) | — | 4.3 | 4.2 | 14.5 | — | 3.9 | — | 4.1 |
| SrO (mol %) | — | — | — | — | — | — | — | — |
| BaO (mol %) | — | — | — | — | — | — | 3.8 | — |
| $SiO_2$ (mol %) | 3.8 | 16.1 | 15.6 | 9.1 | — | 14.3 | — | 15.2 |
| $Al_2O_3$ (mol %) | — | 5.0 | 4.9 | — | — | 4.5 | — | 4.8 |
| $ZrO_2$ (mol %) | — | — | — | — | — | — | — | 4.5 |
| $Gd_2O_3$ (mol %) | — | — | 2.1 | — | — | 9.9 | — | — |
| Sum (mol %) | 100.0 | 100.0 | 100.0 | 100.0 | 100.0 | 100.0 | 100.0 | 100.0 |
| $P_2O_5 + B_2O_3$ (mol %) | 51.5 | 33.3 | 32.8 | 34.2 | 45.1 | 30.2 | 45.8 | 32.0 |
| $P_2O_5$ (mol %)/ZnO (mol %) | 0.0 | 0.0 | 0.0 | 0.0 | 0.0 | 0.0 | 0.0 | 0.0 |
| Refractive index ($n_d$) | 2.03 | 1.97 | 1.98 | 2.04 | 1.88 | 2.01 | 1.91 | 1.98 |
| $\alpha_{50\text{-}300}$ (×$10^{-7}$/° C.) | 90 | 81 | 81 | 86 | 73 | 83 | 83 | 80 |
| Tg (° C.) | 434 | 454 | 465 | 459 | 467 | 494 | 453 | 465 |
| Ts (° C.) | 511 | 543 | 557 | 541 | 554 | 592 | 540 | 558 |
| Specific gravity | 6.24 | 5.74 | 5.83 | 6.08 | 5.28 | 6.16 | 5.47 | 5.73 |

TABLE 3

|  | Scattering material 1 | Scattering material 2 | Scattering material 3 | Scattering material 4 | Scattering material 5 | Scattering material 6 |
|---|---|---|---|---|---|---|
| $P_2O_5$ (mol %) | 0.0 | 0.0 | 0.0 | 0.0 | 0.0 | 0.0 |
| $B_2O_3$ (mol %) | 52.5 | 57.5 | 47.0 | 70.0 | 40.0 | 41.5 |
| ZnO (mol %) | 0.0 | 0.0 | 12.0 | 0.0 | 10.5 | 3.5 |
| $Bi_2O_3$ (mol %) | 0.0 | 0.0 | 0.0 | 0.0 | 0.0 | 0.0 |
| $SiO_2$ (mol %) | 30.0 | 25.0 | 32.0 | 18.0 | 36.0 | 45.0 |
| $Li_2O$ (mol %) | 5.8 | 5.8 | 0.0 | 4.0 | 0.0 | 0.0 |
| $Na_2O$ (mol %) | 5.8 | 5.8 | 3.0 | 4.0 | 6.0 | 0.0 |
| $K_2O$ (mol %) | 5.9 | 5.9 | 6.0 | 4.0 | 7.5 | 10.0 |
| Sum (mol %) | 100.0 | 100.0 | 100.0 | 100.0 | 100.0 | 100.0 |
| $SiO_2 + B_2O_3$ (mol %) | 82.5 | 82.5 | 79 | 88 | 76.0 | 87.0 |
| $Li_2O + Na_2O + K_2O$ (mol %) | 17.5 | 17.5 | 9.0 | 12.0 | 13.5 | 10.0 |
| Refractive index ($n_d$) | 1.51 | 1.51 | 1.52 | 1.49 | 1.52 | 1.51 |
| $\alpha_{50-300}$ (×$10^{-7}$/° C.) | 92 | 91 | 72 | 90 | 81 | 73 |
| Tg (° C.) | 447 | 436 | 475 | 391 | 482 | 471 |
| Ts (° C.) | 588 | 574 | 583 | 540 | 592 | 599 |
| Specific gravity | 2.2 | 2.2 | 2.5 | 2.1 | 2.5 | 2.6 |

TABLE 4

|  | Scattering material 7 | Scattering material 8 | Scattering material 9 | Scattering material 10 | Scattering material 11 | Scattering material 12 | Scattering material 13 | Scattering material 14 | Scattering material 15 |
|---|---|---|---|---|---|---|---|---|---|
| $P_2O_5$ (mol %) | 0.0 | 0.0 | 0.0 | 0.0 | 4.5 | 0.0 | 0.0 | 0.0 | 18.4 |
| $B_2O_3$ (mol %) | 42.3 | 47.4 | 33.3 | 54.6 | 32.0 | 47.4 | 45.2 | 41.3 | 17.6 |
| ZnO (mol %) | 36.1 | 32.1 | 13.4 | 25.4 | 12.8 | 36.9 | 30.6 | 35.3 | 50.7 |
| $Bi_2O_3$ (mol %) | 15.5 | 15.7 | 27.9 | 20.0 | 26.6 | 10.9 | 15.0 | 15.2 | 13.3 |
| $TiO_2$ (mol %) | 0.0 | 0.0 | 4.3 | 0.0 | 4.1 | 0.0 | 0.0 | 0.0 | 0.0 |
| SrO (mol %) | 0.0 | 0.0 | 0.0 | 0.0 | 0.0 | 0.0 | 4.6 | 0.0 | 0.0 |
| BaO (mol %) | 0.0 | 0.0 | 0.0 | 0.0 | 0.0 | 0.0 | 0.0 | 0.0 | 0.0 |
| $SiO_2$ (mol %) | 1.0 | 1.0 | 16.1 | 0.0 | 15.2 | 0.0 | 1.0 | 1.0 | 0.0 |
| $Al_2O_3$ (mol %) | 5.1 | 3.8 | 5.0 | 0.0 | 4.8 | 4.8 | 3.6 | 5.0 | 0.0 |
| $ZrO_2$ (mol %) | 0.0 | 0.0 | 0.0 | 0.0 | 0.0 | 0.0 | 0.0 | 0.0 | 0.0 |
| $Gd_2O_3$ (mol %) | 0.0 | 0.0 | 0.0 | 0.0 | 0.0 | 0.0 | 0.0 | 2.2 | 0.0 |
| Sum (mol %) | 100 | 100 | 100 | 100 | 100 | 100 | 100 | 100 | 100 |
| $P_2O_5 + B_2O_3$ (mol %) | 42.3 | 47.4 | 33.3 | 54.6 | 36.5 | 47.4 | 45.2 | 41.3 | 36.0 |
| $P_2O_5$ (mol %)/ZnO (mol %) | 0.0 | 0.0 | 0.0 | 0.0 | 0.14 | 0.0 | 0.0 | 0.0 | 0.36 |
| Refractive index ($n_d$) | 1.87 | 1.84 | 1.97 | 1.89 | 1.93 | 1.81 | 1.84 | 1.88 | 1.80 |
| $\alpha_{50-300}$ (×$10^{-7}$/° C.) | 72 | 71 | 81 | 76 | 83 | 65 | 75 | 72 | 463 |
| Tg (° C.) | 473 | 477 | 454 | 475 | 467 | 494 | 476 | 484 | 81 |
| Ts (° C.) | 564 | 574 | 543 | 545 | 565 | 592 | 569 | 578 | 557 |
| Specific gravity | 5.03 | 4.87 | 5.74 | 5.25 | 5.5 | 4.51 | 4.89 | 5.12 | 4.97 |

Thereafter, fakes of glass was manufactured by weighing and mixing the raw materials to obtain the glass having the compositions shown in Tables 1~4, and then dissolving the mixture, pouring the molten fluid between a pair of rolls and rapidly cooling the fluid. Powder of the glass was obtained by dry-milling the manufactured flakes with a ball mill made of alumina for one hour. The mass average particle diameters of the powder of the obtained glass were all 3 μm. Thereafter, glass flakes having the compositions shown in Tables 9 and 10 were manufactured by combining the powder of the obtained glass with the volume percents shown in Tables 5~8.

TABLE 6

|  | Comparative example 1 | Comparative example 2 | Comparative example 3 | Comparative example 4 |
|---|---|---|---|---|
| Base material | Base material 1 | Base material 2 | Base material 3 | Base material 4 |
| Volume % | 100 | 100 | 100 | 100 |
| Scattering material | None | None | None | None |
| Volume % | 0 | 0 | 0 | 0 |

TABLE 5

|  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Base material | Base material 1 | Base material 2 | Base material 3 | Base material 4 | Base material 3 | Base material 3 | Base material 1 | Base material 1 | Base material 3 | Base material 3 |
| Volume % | 95 | 95 | 95 | 95 | 95 | 95 | 95 | 95 | 95 | 95 |
| Scattering material | Scattering material 4 | Scattering material 2 | Scattering material 2 | Scattering material 1 | Scattering material 1 | Scattering material 4 | Scattering material 3 | Scattering material 6 | Scattering material 5 | Scattering material 6 |
| Volume % | 5 | 5 | 5 | 5 | 5 | 5 | 5 | 5 | 5 | 5 |

TABLE 7

|  | Ex. 11 | Ex. 12 | Ex. 13 | Ex. 14 | Ex. 15 | Ex. 16 | Ex. 17 | Ex. 18 | Ex. 19 | Ex. 20 | Ex. 21 | Ex. 22 |
|---|---|---|---|---|---|---|---|---|---|---|---|---|
| Base material | Base material 6 | Base material 6 | Base material 7 | Base material 7 | Base material 5 | Base material 6 | Base material 8 | Base material 9 | Base material 10 | Base material 11 | Base material 12 | Base material 13 |
| Volume % | 60 | 40 | 85 | 20 | 72 | 72 | 50 | 75 | 75 | 75 | 75 | 80 |
| Scattering material | Scattering material 7 | Scattering material 7 | Scattering material 8 | Scattering material 8 | Scattering material 9 | Scattering material 10 | Scattering material 11 | Scattering material 12 | Scattering material 12 | Scattering material 13 | Scattering material 14 | Scattering material 15 |
| Volume % | 40 | 60 | 15 | 80 | 28 | 28 | 50 | 25 | 25 | 25 | 25 | 20 |

TABLE 8

|  | Comp. Ex. 5 | Comp. Ex. 6 | Comp. Ex. 7 | Comp. Ex. 8 | Comp. Ex. 9 | Comp. Ex. 10 | Comp. Ex. 11 | Comp. Ex. 12 |
|---|---|---|---|---|---|---|---|---|
| Base material | Base material 5 | Base material 6 | Base material 7 | Base material 8 | Base material 9 | Base material 10 | Base material 11 | Base material 12 |
| Volume % | 100 | 100 | 100 | 100 | 100 | 100 | 100 | 100 |
| Scattering material | None | None | None | None | None | None | None | None |
| Volume % | 0 | 0 | 0 | 0 | 0 | 0 | 0 | 0 |

TABLE 9

| (mol %) | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| $P_2O_5$ (mol %) | 16.2 | 7.0 | 0.0 | 0.0 | 0.0 | 0.0 | 16.2 | 16.2 | 0.0 | 0.0 |
| $B_2O_3$ (mol %) | 18.9 | 41.1 | 54.7 | 47.8 | 54.5 | 55.4 | 17.7 | 17.4 | 53.9 | 53.9 |
| ZnO (mol %) | 44.5 | 30.8 | 24.1 | 30.8 | 24.1 | 24.1 | 45.1 | 45.0 | 24.7 | 24.3 |
| $Bi_2O_3$ (mol %) | 19.0 | 19.0 | 19.0 | 19.0 | 19.0 | 19.0 | 19.0 | 19.0 | 19.0 | 19.0 |
| $SiO_2$ (mol %) | 0.9 | 1.3 | 1.3 | 1.5 | 1.5 | 0.9 | 1.6 | 1.8 | 1.8 | 2.3 |
| $Li_2O$ (mol %) | 0.2 | 0.3 | 0.3 | 0.3 | 0.3 | 0.2 | 0.0 | 0.0 | 0.0 | 0.0 |
| $Na_2O$ (mol %) | 0.2 | 0.3 | 0.3 | 0.3 | 0.3 | 0.2 | 0.2 | 0.3 | 0.3 | 0.0 |
| $K_2O$ (mol %) | 0.2 | 0.3 | 0.3 | 0.3 | 0.3 | 0.2 | 0.3 | 0.4 | 0.4 | 0.5 |
| Sum (mol %) | 100 | 100 | 100 | 100 | 100 | 100 | 100 | 100 | 100 | 100 |
| $B_2O_3 + SiO_2$ (mol %) | 19.8 | 42.3 | 56.0 | 49.3 | 56.0 | 56.3 | 19.3 | 19.2 | 55.7 | 56.2 |

TABLE 10

| (mol %) | Ex. 11 | Ex. 12 | Ex. 13 | Ex. 14 | Ex. 15 | Ex. 16 | Ex. 17 | Ex. 18 | Ex. 19 | Ex. 20 | Ex. 21 | Ex. 22 |
|---|---|---|---|---|---|---|---|---|---|---|---|---|
| $P_2O_5$ (mol %) | 0.0 | 0.0 | 0.0 | 0.0 | 0.0 | 0.0 | 2.2 | 0.0 | 0.0 | 0.0 | 0.0 | 17.3 |
| $B_2O_3$ (mol %) | 37.3 | 39.0 | 35.2 | 44.7 | 46.1 | 39.7 | 33.1 | 45.7 | 35.2 | 45.7 | 34.5 | 16.5 |
| ZnO (mol %) | 23.3 | 27.8 | 16.3 | 28.7 | 10.0 | 17.0 | 13.3 | 38.0 | 19.3 | 31.0 | 18.9 | 47.6 |
| $Bi_2O_3$ (mol %) | 22.5 | 20.0 | 25.4 | 17.8 | 33.7 | 25.5 | 27.6 | 15.1 | 21.0 | 18.1 | 23.5 | 18.6 |
| $TiO_2$ (mol %) | 2.4 | 1.6 | 3.5 | 0.8 | 1.3 | 3.0 | 9.5 | 0.0 | 2.8 | 0.0 | 3.0 | 0.0 |
| SrO (mol %) | 0.0 | 0.0 | 0.0 | 0.0 | 0.0 | 0.0 | 0.0 | 0.0 | 0.0 | 1.2 | 0.0 | 0.0 |
| BaO (mol %) | 0.0 | 0.0 | 0.0 | 0.0 | 0.0 | 0.0 | 0.0 | 0.0 | 0.0 | 2.8 | 0.0 | 0.0 |
| $SiO_2$ (mol %) | 9.5 | 6.5 | 13.2 | 3.6 | 7.4 | 11.3 | 12.0 | 0.0 | 10.1 | 0.3 | 11.3 | 0.0 |
| $Al_2O_3$ (mol %) | 5.0 | 5.1 | 4.7 | 4.0 | 1.5 | 3.5 | 2.3 | 1.2 | 4.6 | 0.9 | 4.9 | 0.0 |
| $ZrO_2$ (mol %) | 0.0 | 0.0 | 0.0 | 0.0 | 0.0 | 0.0 | 0.0 | 0.0 | 0.0 | 0.0 | 3.3 | 0.0 |
| $Gd_2O_3$ (mol %) | 0.0 | 0.0 | 1.7 | 0.4 | 0.0 | 0.0 | 0.0 | 0.0 | 7.0 | 0.0 | 0.6 | 0.0 |
| Sum (mol %) | 100 | 100 | 100 | 100 | 100 | 100 | 100 | 100 | 100 | 100 | 100 | 100 |

Each glass paste was manufactured by kneading each glass frit of 75 g with an organic vehicle of 25 g (obtained by dissolving ethylcellulose of 10 wt % in α-terpineol). Each glass paste was uniformly printed at the center position in a circular size having a diameter of 1 cm such that the thickness after firing became 30 μm, on a soda-lime glass substrate coated with a silica film on the surface and having a size of 2 cm² square and a thickness of 0.55 mm. The glass paste was dried at 150° C. for 30 minutes, and then the temperature was returned to the room temperature and increased up to 450° C. for 30 minutes, and the resin of the organic vehicle was decomposed and allowing to disappear with the temperature maintained at 450° C. for 30 minutes. Thereafter, each glass frit was softened by increasing the temperature up to the firing temperatures shown in Tables 11~14 only after 12 minutes and keeping the firing temperatures shown in Tables 11~14 for 30 minutes. Thereafter, a scattering layer was formed on the soda-lime glass substrate by decreasing the temperature to the room temperature for 3 hours.

The total light transmittance and haze were measured as optical characteristics, for each scattering layer. A haze computer (Hz-2) made by Suga Test Instrument Co., Ltd. was used for the measurement.

The surface states of the scattering layers were observed by an SEM. Local unevenness that cause a short between the electrodes of the organic LED having waviness were not seen from the surfaces of the scattering layers.

The result of measuring the total light transmittance and the haze and observing the surface flatness and smoothness was shown in Tables 11~14. For the surface flatness and smoothness, "○" was given to when all the scattering material glass and the base material glass are flat and smooth and "Δ" was given to when the scattering material glass was formed in a convex shape, which is waviness, on the surface of the base material glass.

TABLE 11

|  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Base material | Base material 1 | Base material 2 | Base material 3 | Base material 4 | Base material 3 | Base material 3 | Base material 1 | Base material 1 | Base material 3 | Base material 3 |
| Volume % | 95 | 95 | 95 | 95 | 95 | 95 | 95 | 95 | 95 | 95 |
| Scattering material | Scattering material 4 | Scattering material 2 | Scattering material 2 | Scattering material 1 | Scattering material 1 | Scattering material 4 | Scattering material 3 | Scattering material 6 | Scattering material 5 | Scattering material 6 |
| Volume % | 5 | 5 | 5 | 5 | 5 | 5 | 5 | 5 | 5 | 5 |
| Firing temperature (° C.) | 520 | 530 | 530 | 520 | 530 | 530 | 540 | 540 | 530 | 530 |
| Haze (%) | 72 | 84 | 89 | 92 | 92 | 84 | 89 | 86 | 93 | 93 |
| Total light transmittance (%) | 71 | 64 | 73 | 76 | 60 | 74 | 61 | 78 | 71 | 67 |
| Surface flatness and smoothness | ○ | ○ | ○ | ○ | ○ | ○ | ○ | Δ | Δ | Δ |

TABLE 12

|  | Comp. Ex. 1 | Comp. Ex. 2 | Comp. Ex. 3 | Comp. Ex. 4 |
|---|---|---|---|---|
| Base material | Base material 1 | Base material 2 | Base material 3 | Base material 4 |
| Volume % | 100 | 100 | 100 | 100 |
| Scattering material | None | None | None | None |
| Volume % | 0 | 0 | 0 | 0 |
| Firing temperature(° C.) | 520 | 530 | 530 | 520 |
| Haze(%) | 41 | 60 | 38 | 54 |
| Total light transmittance(%) | 73 | 68 | 69 | 79 |
| Surface flatness and smoothness | ○ | ○ | ○ | ○ |

TABLE 13

| (mol %) | Ex. 11 | Ex. 12 | Ex. 13 | Ex. 14 | Ex. 15 | Ex. 16 | Ex. 17 | Ex. 18 | Ex. 19 | Ex. 20 | Ex. 21 | Ex. 22 |
|---|---|---|---|---|---|---|---|---|---|---|---|---|
| Base material | Base material 6 | Base material 6 | Base material 7 | Base material 7 | Base material 5 | Base material 6 | Base material 8 | Base material 9 | Base material 10 | Base material 11 | Base material 12 | Base material 1 |
| Volume % | 60 | 40 | 85 | 20 | 72 | 72 | 50 | 75 | 75 | 75 | 75 | 80 |
| Scattering material | Scattering material 7 | Scattering material 7 | Scattering material 8 | Scattering material 8 | Scattering material 9 | Scattering material 10 | Scattering material 11 | Scattering material 12 | Scattering material 12 | Scattering material 13 | Scattering material 14 | Scattering material 15 |
| Volume % | 40 | 60 | 15 | 80 | 28 | 28 | 50 | 25 | 25 | 25 | 25 | 20 |
| Firing temperature (° C.) | 525 | 525 | 530 | 530 | 500 | 525 | 525 | 540 | 550 | 525 | 530 | 520 |
| Haze (%) | 92 | 92 | 93 | 94 | 91 | 60 | 93 | 77 | 83 | 87 | 79 | 80 |
| Total light transmittance (%) | 93 | 92 | 86 | 89 | 75 | 78 | 74 | 70 | 68 | 86 | 78 | 70 |
| Surface flatness and Smoothness | ○ | ○ | ○ | ○ | ○ | ○ | ○ | ○ | ○ | ○ | ○ | ○ |

TABLE 14

|  | Comp. Ex. 5 | Comp. Ex. 6 | Comp. Ex. 7 | Comp. Ex. 8 | Comp. Ex. 9 | Comp. Ex. 10 | Comp. Ex. 11 | Comp. Ex. 12 |
|---|---|---|---|---|---|---|---|---|
| Base material | Base material 5 | Base material 6 | Base material 7 | Base material 8 | Base material 9 | Base material 10 | Base material 11 | Base material 12 |

TABLE 14-continued

|  | Comp. Ex. 5 | Comp. Ex. 6 | Comp. Ex. 7 | Comp. Ex. 8 | Comp. Ex. 9 | Comp. Ex. 10 | Comp. Ex. 11 | Comp. Ex. 12 |
|---|---|---|---|---|---|---|---|---|
| Volume % | 100 | 100 | 100 | 100 | 100 | 100 | 100 | 100 |
| Scattering material | None | None | None | None | None | None | None | None |
| Volume % | 0 | 0 | 0 | 0 | 0 | 0 | 0 | 0 |
| Firing temperature (° C.) | 500 | 525 | 530 | 525 | 550 | 550 | 525 | 530 |
| Haze (%) | 64 | 55 | 50 | 70 | 66 | 73 | 49 | 68 |
| Total light transmittance (%) | 75 | 85 | 84 | 71 | 71 | 70 | 81 | 73 |
| Surface flatness and smoothness | ◯ | ◯ | ◯ | ◯ | ◯ | ◯ | ◯ | ◯ |

It can be seen from Tables 11~14 that the scattering layer of the organic LED elements in Examples 1~22 has a large haze value as high transmittance, that is, large diffusion transmittance. In the scattering layer of the organic LED element, it is easy to adjust the composition, the size, and the addition amount of the scattering material and it is possible to uniformly improve element characteristics and improve reliability.

A test for checking improvement of a light extraction efficiency is described hereafter.

Figure 4:
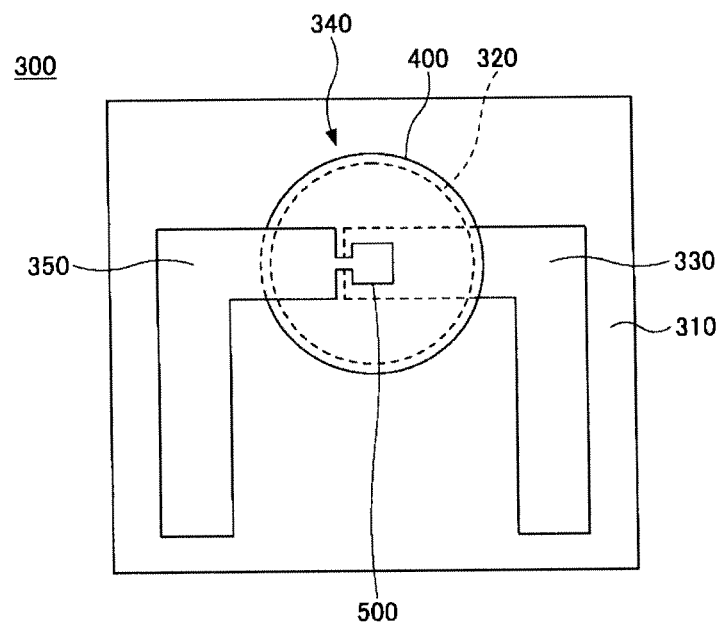
FIG. 4 is a front view of an example of an organic LED element using a glass substrate with the scattering layer of Example 11.

A glass substrate with the scattering layer of Example 11 was prepared and the organic EL element shown in FIG. 4 was manufactured. An opposite substrate is not shown in FIG. 4.

The glass substrate with the scattering layer of Example 11 was formed by printing a scattering layer 320 having a circular pattern with a diameter of 1 cm on a glass substrate 310 coated with a silica film on the surface (PD200 made by Asahi Glass Co., Ltd.). In the scattering layer 320, the base material 6 described above was used as a base material and the scattering material 7 described above was used as a scattering material.

First, an ITO film was formed to be 150 nm thick a transparent electrode 330 by using a DC magnetron spatter. The film was formed in a desired shape by using a mask in spattering. The refractive index of ITO and the refractive index of the base material 6 were shown in FIG. 7.

Next, ultrasonic cleaning that uses pure water and IPA was performed and then the surface was cleaned by radiating ultraviolet rays with an excimer UV generator.

Next, as an organic layer 340, an α-NPD(N,N'-diphenyl-N,N'-bis(1-naphthyl)-I, I' biphenyl-4,4" diamine) film was formed to be 100 nm thick, an Alq3(tris8-hydroxyquinoline aluminum) film was formed to be 60 nm thick and a LiF film was formed to be 0.5 nm thick, and as a reflective electrode 350, an Al film was formed to be 80 nm thick. At this time, α-NPD and Alq3 forms a circular pattern 400 having a diameter of 12 mm by using a mask (see FIG. 4), and LiF and Al forms a pattern by using a mask having a region 500 (see FIG. 4) of 2 mm square on the ITO pattern via the organic film (α-NPD or Alq3), thereby achieving an element substrate.

Thereafter, recessions were partially formed on the separately prepared glass substrate (PD200 made by Asahi Glass Co., Ltd.) by performing a sandblast process, thereby manufacturing an opposite substrate. Photosensitive resin was applied to the bank around the recession, for peripheral sealing.

Next, the element substrate and the opposite substrate were put in a glove box in a nitrogen atmosphere, a desiccant containing CaO was attached to the recession of the opposite substrate, the element substrate and the opposite substrate were stacked to each other, and the resin for peripheral sealing was cured by radiating ultraviolet rays, thereby obtaining the organic EL element 300.

For comparison, an organic EL element 300A (see FIG. 6) was manufactured in the same way as above, except that the glass substrate 310 without the scattering layer 320 was used, instead of the glass substrate 310 with the scattering layer 320.

Figure 5:
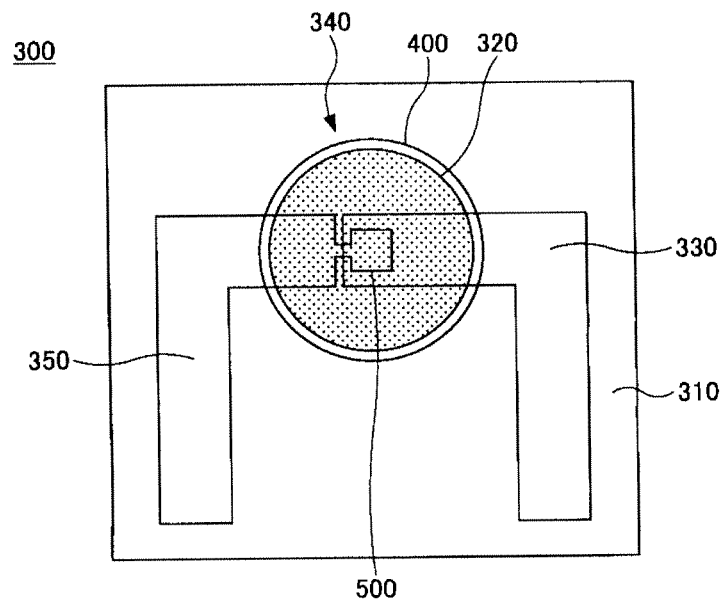
FIG. 5 is a view showing a state that the organic LED element of FIG. 4 emits light.
Figure 6:
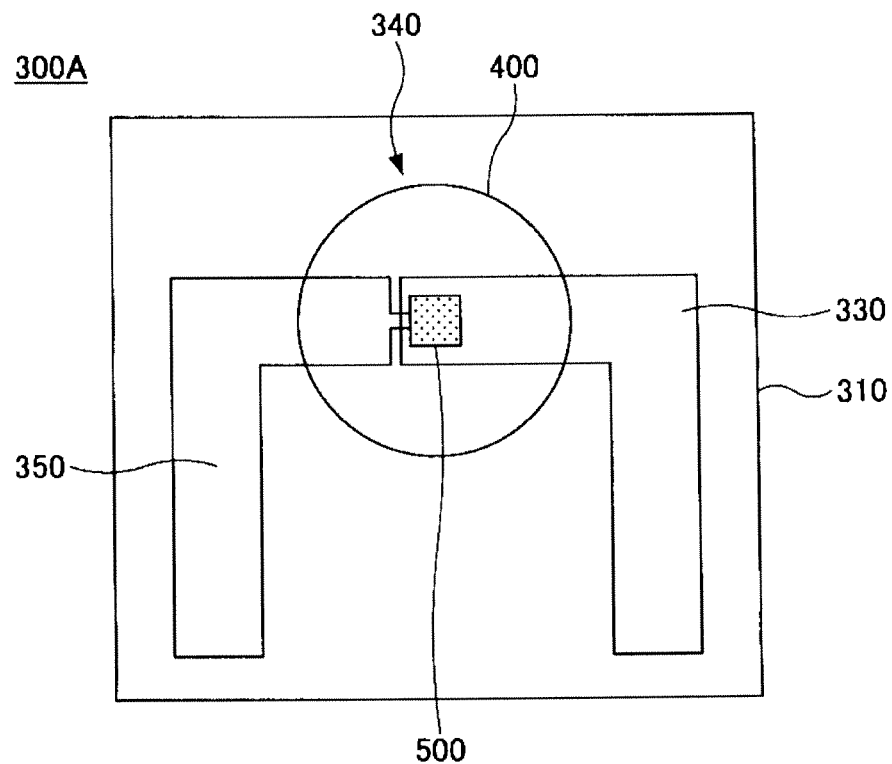
FIG. 6 is a view showing a state that the organic LED element of a comparative example against FIG. 4 emits light.

FIGS. 5 and 6 show states that the elements 300 and 300A emit light. FIG. 5 shows a state that the element 300 with the scattering layer 320 emits light and FIG. 6 shows a state that the element 300A without the scattering layer 320 emits light. In FIGS. 5 and 6, the ITO pattern and the like are shown by a solid line and the emission regions are shown by a dotted pattern.

When there is the scattering layer 320, as shown in FIG. 5, it could be seen that light is extracted to the atmosphere not only from a region 500 of substantially 2 mm☐ where the ITO pattern and the Al pattern cross each other, but the peripheral region (region corresponding to the scattering layer 320).

On the other hand, in the case where there is no scattering layer 320, as shown in FIG. 6, it could be seen that light is emitted only from the region 500.

Figure 7:
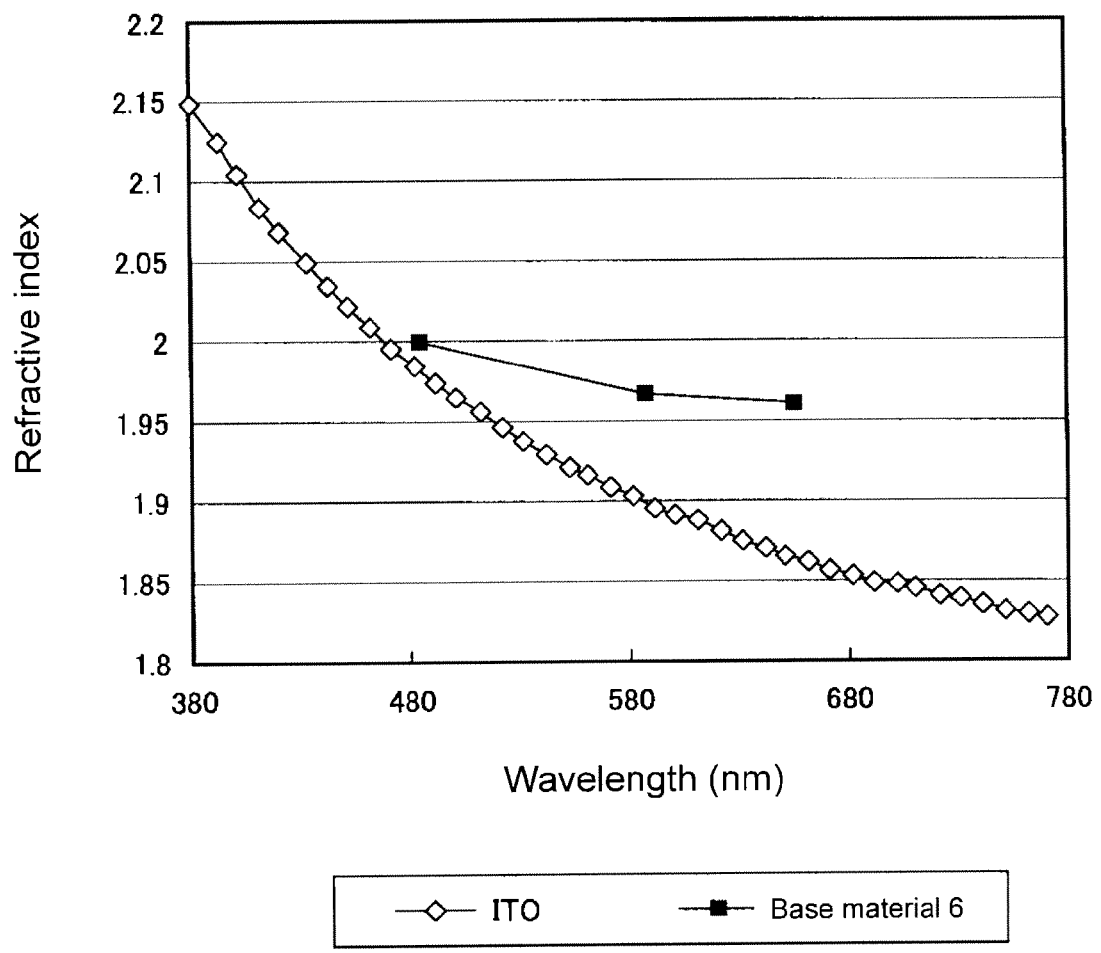
FIG. 7 is a characteristic diagram showing a refractive index of ITO and a refractive index of a base material 6 which are used in the organic LED element of FIG. 4.
Figure 8:
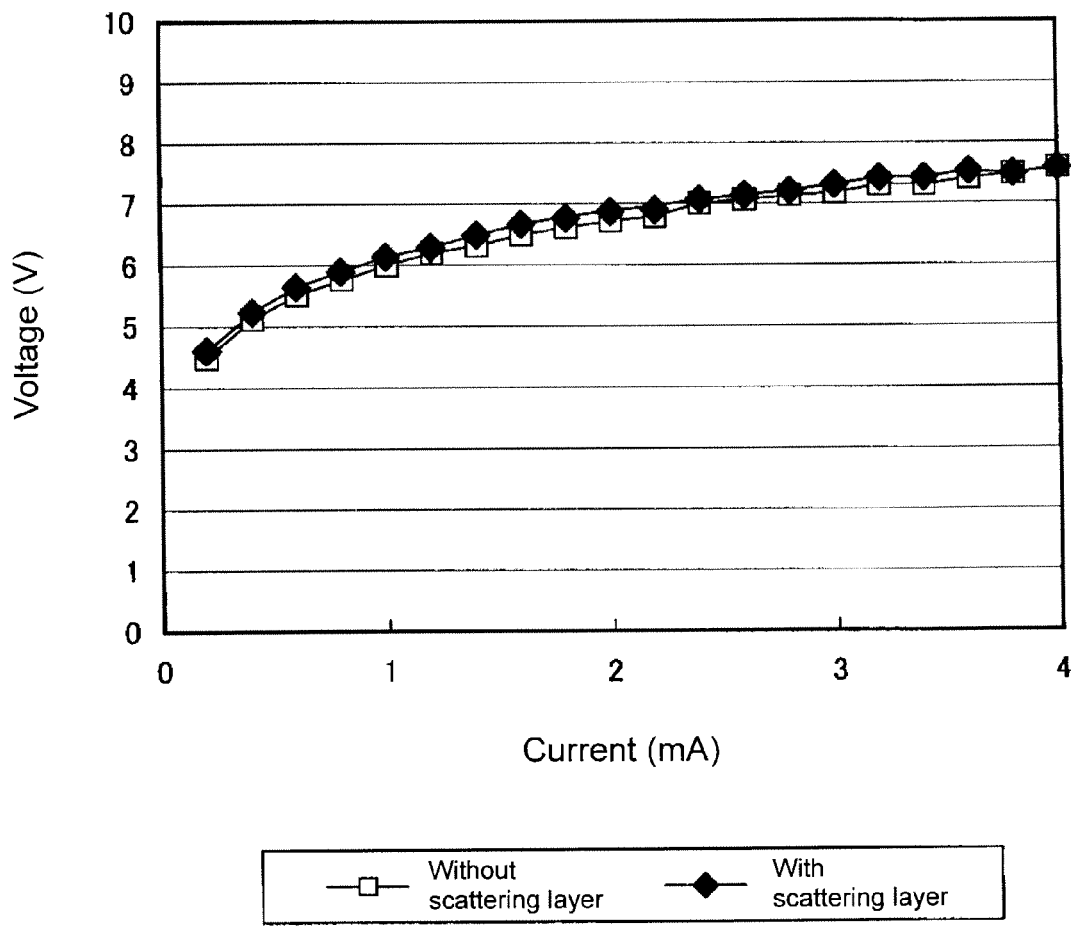
FIG. 8 is a characteristic diagram showing currents and voltages of the organic LED element of FIG. 4 and a comparative example thereof.
Figure 9:
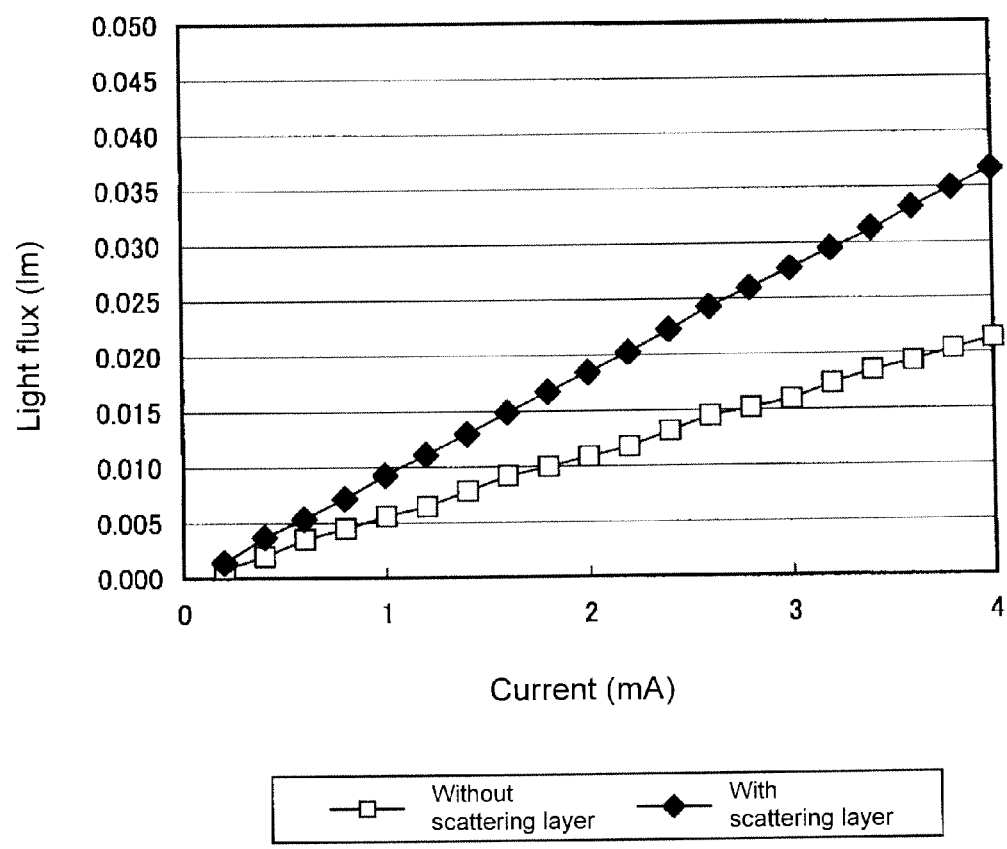
FIG. 9 is a characteristic diagram showing currents and light flux of the organic LED element of FIG. 4 and a comparative example thereof.

Thereafter, optical characteristic test was performed on the elements 300 and 300A. First, the total light flux was measured by an External Quantum Efficiency Measurement. System C9920-12 made by Hamamatsu Photonics K.K. FIG. 8 shows current and voltage characteristics in the element 300 with the scattering layer 320 and the element 300A without the scattering layer 320. As shown in FIG. 8, it could be seen that, regardless of whether there is the scattering layer 320, it was possible to achieve substantially the same degree of characteristics, and there was no large leak current even in the element 300 with a translucent electrode 330 on the scattering layer 320. Next, FIG. 9 shows the current and light flux characteristics. As shown in FIG. 9, regardless of whether there is the scattering layer 320, the amount of light flux is in proportionate to the current. Further, it could be seen that the amount of light flux was improved by 71%, as compared with the case that there is no scattering layer 320. This shows that, as shown in FIG. 7, since the refractive index of the base material of the scattering layer 320 is higher than the refractive index of ITO, which is a translucent electrode at an emission wavelength (450 nm to 700 nm) of Alq3, the EL emission light of Alq3 is prevented from totally reflected from the interface between the translucent electrode 330 and the scattering layer 320, such that light is efficiently extracted to the atmosphere.

Figure 10:
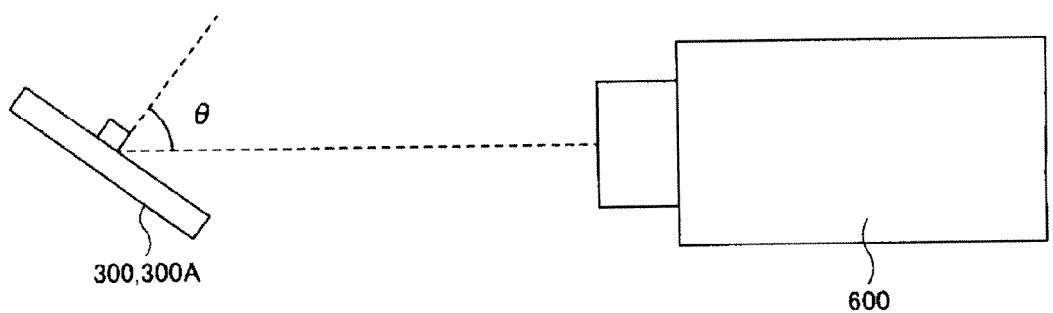
FIG. 10 is a diagram illustrating a method of estimating angular dependency of emission.

Next, angular dependency of emission was estimated. The angular dependency of emission was measured by using a Luminance Colorimeter (Product Name: BM-7A) made by Topcon Technohouse Corporation while rotating the elements 300 and 300A with respect to a luminance meter 600. The elements were turned on by applying a current of 1 mA in measuring. The angle was defined as a measurement angle θ (unit: °) that was made by the nominal direction of the elements 300 and 300A and the direction from the elements 300 and 300A to the luminance meter 600 (see FIG. 10). That is, the angle is 0° when the luminance meter 600 is disposed on the front of the elements 300 and 300A. The luminance data obtained by the measuring is shown in FIG. 11.

Figure 11:
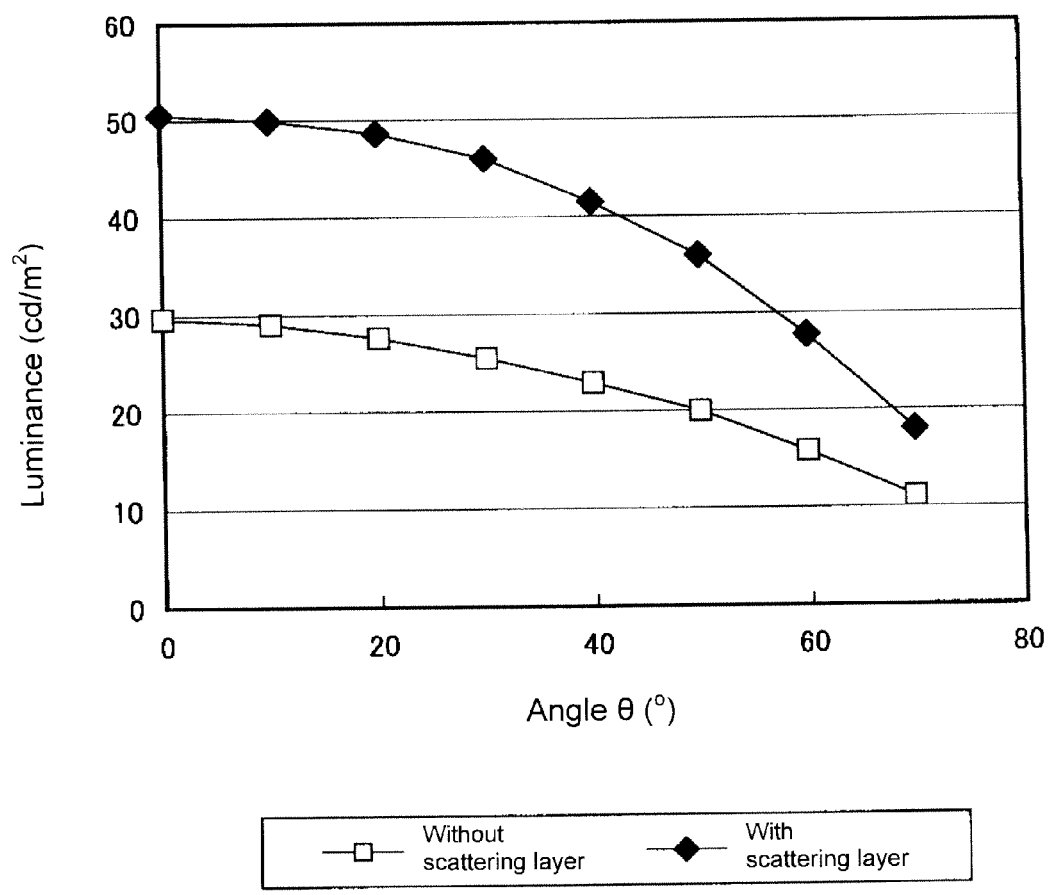
FIG. 11 is a characteristic diagram showing emission luminance of the organic LED element of FIG. 4 and a comparative example thereof.

It can be seen from FIG. 11 that high luminance is shown at any measurement angle when there is the scattering layer 320, as compared with the case that there is no scattering layer 320. Further, it can be seen the amount of light flux was improved by 78% when there is the scattering layer 320 as compared with the case that there is no scattering layer 320, when calculating the total light flux by integrating the luminance data with the solid angles. This is substantially the same as the measurement result in the measuring device of total light flux and shows that the amount of light flux was considerably improved by the scattering layer 320.

Figure 12:
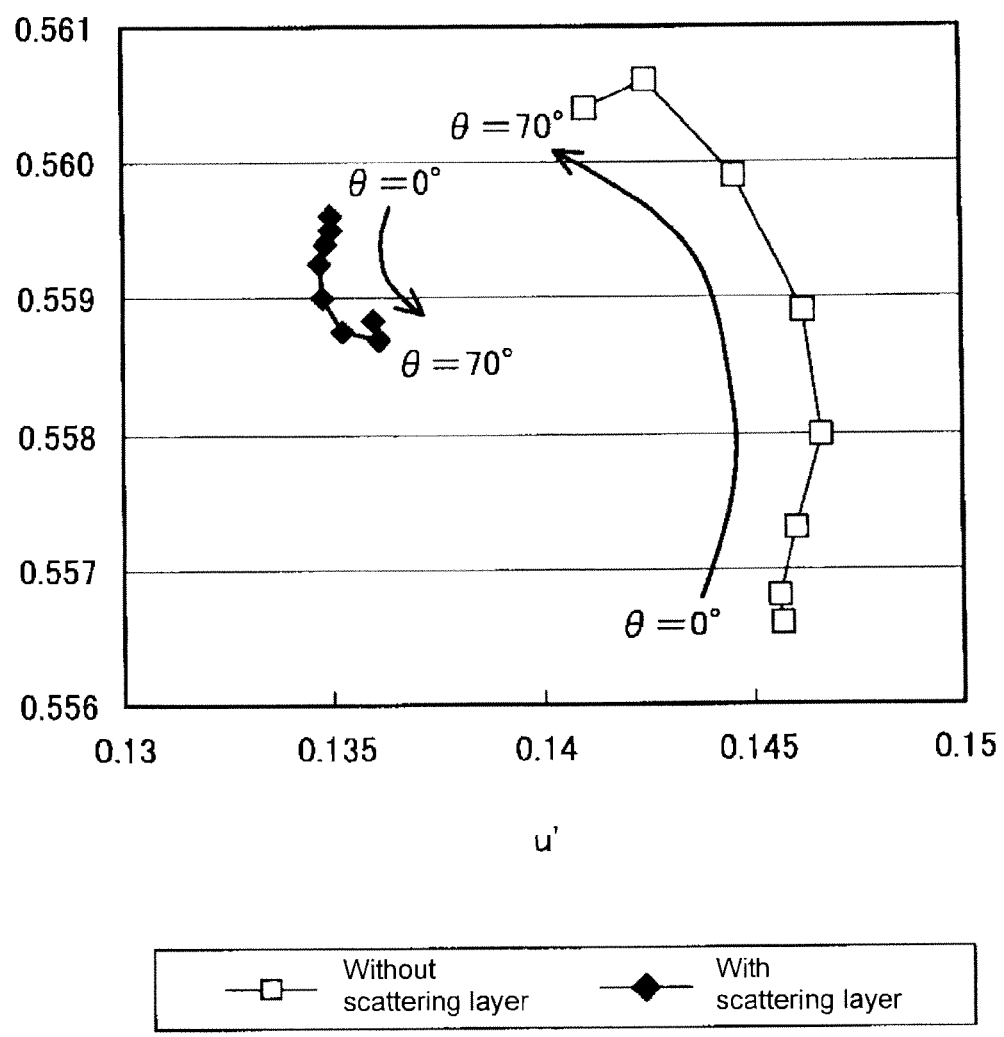
FIG. 12 is a chromaticity diagram showing chromatic variation when the angle θ is changed from 0° to 70° in the organic LED element of FIG. 4 and a comparative example thereof.

Next, it can be seen from FIG. 12 that the chromaticity u' and v' was greatly changed by the measurement angle θ in the element 300A without the scattering layer 320, whereas the change was reduced in the element 300 with the scattering layer 320. It could be seen from the results that it is possible to improve the light extraction efficiency, which is the original object, by providing the element with the scattering layer 320, and it is possible to achieve more effect that attenuation of an angle change of color. The small angle change of color is a large advantage of a light emitting element in that the viewing angle is not limited.

Although the present invention was described in detail with reference to a specific embodiment, it is apparent to hose that the present invention may be changed or modified in various ways without departing from the scope of the present invention.

The present application is based on Japanese Patent Applications No. 2009-238674 filed on Oct. 15, 2009 and No. 2010-105714 filed on Apr. 30, 2010, the disclosure of which is incorporated herein by reference in its entity.

INDUSTRIAL APPLICABILITY

According to the present invention, it is possible to provide an organic LED element having high emission efficiency and high reproducibility of element characteristics, and a glass frit for the scattering layer.

DESCRIPTION OF THE REFERENCE NUMERALS AND SIGNS

| | |
|---|---|
| 110 | Transparent substrate |
| 120 | Scattering layer |
| 130 | First electrode |
| 140 | Organic layer |
| 150 | Second electrode |
| 210 | Second electrode |

The invention claimed is:

1. An organic LED element sequentially comprising:
a transparent substrate;
a scattering layer;
a first electrode;
an organic layer; and
a second electrode,
wherein the scattering layer includes a first glass material and a second glass material dispersed in the first glass material and having a different refractive index from the first glass material, and
wherein the scattering layer comprises $SiO_2$—$B_2O_3$—$Bi_2O_3$—ZnO-based glass, and the second glass material contains $SiO_2$ or $B_2O_3$ of which the contents are larger and $Bi_2O_3$ of which the content is smaller than the first glass material in terms of mol % on the basis of oxides.

2. The organic LED element according to claim 1, wherein the scattering layer comprises a glass containing, in terms of mol % on the basis of oxides, $SiO_2$ of 0.1-14%, $Bi_2O_3$ of 10-28%, $B_2O_3$ of 15-63%, ZnO of 14-50%, $P_2O_5$ of 0-20° A, and the sum of $Li_2O$, $Na_2O$ and $K_2O$ of 0-6%.

3. The organic LED element according to claim 1, wherein the first electrode is a transparent electrode.

4. A glass frit for a scattering layer of an organic LED element, comprising at least powder of first glass and powder of second glass,
wherein the first glass has a refractive index of 1.80 or more which is measured at 25° C. by d line of a He lamp (wavelength of 587.6 nm),
the second glass contains $SiO_2$ or $B_2O_3$ of which the contents are larger and $Bi_2O_3$ of which the content is smaller than the first glass in terms of mol % on the basis of oxides, and
a ratio of the powder of the first glass in the glass frit is 70-99 volume %.

5. The glass fit for a scattering layer of an organic LED element according to claim 4, wherein the first glass is glass containing, in terms of mol % on the basis of oxides, $Bi_2O_3$ of 15-28%, $B_2O_3$ of 15-60%, ZnO of 20-50%, $P_2O_5$ of 0-20%, the sum of $Li_2O$, $Na_2O$ and $K_2O$ of 0-2%, the sum of $TiO_2$ and $WO_3$ of 0-12%, $ZrO_2$ of 0-5%, and the sum of MgO, CaO, SrO and BaO of 0-10%.

6. The glass frit for a scattering layer of an organic LED element according to claim 4, wherein the second glass is a glass containing, in terms of mol % on the basis of oxides, $SiO_2$ of 18-45%, $B_2O_3$ of 40-70%, the sum of $Li_2O$, $Na_2O$ and $K_2O$ of 9-18%, and ZnO of 0-15%.

7. A method for manufacturing a scattering layer of an organic LED element, the method comprising forming a scattering layer using the glass frit for a scattering layer of an organic LED element according to claim 4.

8. An organic LED element sequentially comprising:
a transparent substrate;
a scattering layer;
a first electrode;
an organic layer; and
a second electrode,
wherein the scattering layer includes a first glass material and a second glass material dispersed in the first glass material and having a different refractive index from the first glass material, and
the scattering layer contains, in terms of mol % on the basis of oxides, $B_2O_3$ of 15-63%, $Bi_2O_3$ of 10-37%, ZnO of 10-50%, $SiO_2$ of 0-20%, $Al_2O_3$ of 0-10%, $P_2O_5$ of 0-20%, $ZrO_2$ of 0-5%, $Gd_2O_3$ of 0-10%, $TiO_2$ of 0-13%, the sum of $Li_2O$, $Na_2O$ and $K_2O$ of 0-2%, and the sum of MgO, CaO, SrO and BaO of 0-10%.

9. The organic LED element according to claim 8, wherein the first glass material contains, in terms of mol % on the basis of oxides, $B_2O_3$ of 15-63%, $Bi_2O_3$ of 15-37%, ZnO of 5-50%, $SiO_2$ of 0-20%, $Al_2O_3$ of 0-10%, $P_2O_5$ of 0-20%, $ZrO_2$ of 0-5%, $Gd_2O_3$ of 0-10%, $TiO_2$ of 0-15%, the sum of $Li_2O$, $Na_2O$ and $K_2O$ of 0-2%, the sum of MgO, CaO, SrO and BaO of 0-10%, wherein a value obtained by dividing the content of $P_2O_5$ by the content of ZnO is less than 0.48, the sum of the contents of $P_2O_5$ and $B_2O_3$ is 30-60° A, and the content of $P_2O_5$ is 10% or less when the sum of the contents of $P_2O_5$ and $B_2O_3$ exceeds 50%.

10. The organic LED element according to claim 8, wherein the second glass material contains, in terms of mol % on the basis of oxides, $SiO_2$ or $B_2O_3$ of which the contents are larger and $Bi_2O_3$ of which the content is smaller than the first glass material, and contains $B_2O_3$ of 15-55%, $Bi_2O_3$ of 10-28%, ZnO of 10-50%, $SiO_2$ of 0-20%, $Al_2O_3$ of 0-10%, $P_2O_5$ of 0-20%, $ZrO_2$ of 0-5%, $Gd_2O_3$ of 0-10%, $TiO_2$ of 0-5%, the sum of $Li_2O$, $Na_2O$ and $K_2O$ of 0-2%, and the sum of MgO, CaO, SrO and BaO of 0-10%.

11. A glass frit for a scattering layer of an organic LED element, comprising at least powder of first glass and powder of second glass,
wherein the first glass has a refractive index of 1.80 or more which is measured at 25° C. by d line of a He lamp (wavelength of 587.6 nm),
the second glass contains $SiO_2$ or $B_2O_3$ of which the contents are larger and $Bi_2O_3$ of which the content is smaller than the first glass in terms of mol % on the basis of oxides, and
a ratio of the powder of the first glass in the glass frit is 15-99 volume %.

12. The glass fit for a scattering layer of an organic LED element according to claim 11, wherein the first glass contains, in terms of mol % on the basis of oxides, $B_2O_3$ of 15-63%, $Bi_2O_3$ of 15-37%, ZnO of 5-50%, $SiO_2$ of 0-20%, $Al_2O_3$ of 0-10%, $P_2O_5$ of 0-20%, $ZrO_2$ of 0-5%, $Gd_2O_3$ of 0-10%, $TiO_2$ of 0-15%, the sum of $Li_2O$, $Na_2O$ and $K_2O$ of 0-2%, the sum of MgO, CaO, SrO and BaO of 0-10%, wherein a value obtained by dividing the content of $P_2O_5$ by the content of ZnO is less than 0.48, the sum of the contents of $P_2O_5$ and $B_2O_3$ is 30-60%, and the content of $P_2O_5$ is 10% or less when the sum of the contents of $P_2O_5$ and $B_2O_3$ exceeds 50%.

13. The glass frit for a scattering layer of an organic LED element according to claim 11, wherein the second glass contains, in terms of mol % on the basis of oxides, $SiO_2$ or $B_2O_3$ of which the contents are larger and $Bi_2O_3$ of which the content is smaller than the first glass, and contains $B_2O_3$ of 15-55%, $Bi_2O_3$ of 10-28%, ZnO of 10-50%, $SiO_2$ of 0-20%, $Al_2O_3$ of 0-10%, $P_2O_5$ of 0-20%, $ZrO_2$ of 0-5%, $Gd_2O_3$ of 0-10%, $TiO_2$ of 0-5%, the sum of $Li_2O$, $Na_2O$ and $K_2O$ of 0-2%, and the sum of MgO, CaO, SrO and BaO of 0-10%.

14. A method for manufacturing a scattering layer of an organic LED element, the method comprising forming a scattering layer using the glass frit for a scattering layer of a organic LED element according to claim 11.

* * * * *